US012331736B2

(12) United States Patent
Son et al.

(10) Patent No.: US 12,331,736 B2
(45) Date of Patent: Jun. 17, 2025

(54) PUMP, CHEMICAL LIQUID SUPPLYING UNIT, AND SUBSTRATE TREATING APPARATUS

(71) Applicant: SEMES CO., LTD., Cheonan-si (KR)

(72) Inventors: Young Jun Son, Cheonan-si (KR); Byoung Doo Choi, Cheonan-si (KR); Sung Chul Jung, Cheonan-si (KR); Woo Sin Jung, Cheonan-si (KR); Young Un Yun, Asan-si (KR); Woo Ram Lee, Seoul (KR); Ki Sang Eum, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 213 days.

(21) Appl. No.: 17/900,761

(22) Filed: Aug. 31, 2022

(65) Prior Publication Data
US 2023/0072779 A1    Mar. 9, 2023

(30) Foreign Application Priority Data

Sep. 2, 2021  (KR) .................. 10-2021-0116768

(51) Int. Cl.
F04B 43/08 (2006.01)
F04B 45/06 (2006.01)
H01L 21/677 (2006.01)

(52) U.S. Cl.
CPC ............ *F04B 43/084* (2013.01); *F04B 45/06* (2013.01); *H01L 21/67742* (2013.01)

(58) Field of Classification Search
CPC ... F04B 43/084; F04B 45/06; H01L 21/67742
(Continued)

(56) References Cited

U.S. PATENT DOCUMENTS 3,814,547 A * 6/1974 Kitrilakis ............ A61M 60/837
417/430
3,839,983 A * 10/1974 McAusland ............. D04C 1/12
114/230.22

(Continued)

FOREIGN PATENT DOCUMENTS

JP    H04-021780 U    2/1992
JP    H10483994 A    3/1992
(Continued)

*Primary Examiner* — Charles G Freay
(74) *Attorney, Agent, or Firm* — Procopio, Cory, Hargreaves & Savitch LLP

(57) ABSTRACT

Provided is a pump for supplying a liquid. The pump includes: a tube including a pump chamber communicating with a chemical liquid inlet and a chemical liquid outlet, and configured to discharge a chemical liquid through a change in volume due to contraction and expansion; and a driving unit contracting or expanding the tube in a longitudinal direction, in which the tube includes: a flexible tube body including a pump chamber which has an increased internal volume when is contracted in a longitudinal direction and has a decreased internal volume when is expanded in the longitudinal direction, and which has a jar shape of which a radius is increased from the chemical liquid inlet to a center of the pump chamber, and the radius is decreased from the pump chamber to the chemical liquid outlet; a first flange provided at one end of the tube body and including the chemical liquid inlet; and a second flange provided at the other end of the tube body and including the chemical liquid outlet.

20 Claims, 24 Drawing Sheets

(58) Field of Classification Search
USPC .......................................................... 417/478
See application file for complete search history.

(56) References Cited

U.S. PATENT DOCUMENTS

| | | | | |
|---|---|---|---|---|
| 4,906,229 A | * | 3/1990 | Wampler | ............ A61M 60/427 |
| | | | | 417/478 |
| 4,925,377 A | * | 5/1990 | Inacio | ................. A61M 60/109 |
| | | | | 417/478 |
| 5,209,654 A | * | 5/1993 | Lofsjogard Nilsson | ..................... |
| | | | | A61M 60/38 |
| | | | | 417/478 |
| 2002/0194933 A1 | | 12/2002 | Roelofs | |
| 2012/0227395 A1 | | 9/2012 | Gordon | |

FOREIGN PATENT DOCUMENTS

| | | | |
|---|---|---|---|
| JP | 105211107 | A | 8/1993 |
| JP | H06213134 | A | 8/1994 |
| JP | 2002070748 | A | 3/2002 |
| JP | 2012189086 | A | 10/2012 |
| JP | 2014001663 | A | 1/2014 |
| JP | 2020033995 | A | 3/2020 |
| KR | 100751657 | B1 | 8/2007 |
| KR | 100901884 | B1 | 6/2009 |
| KR | 100910703 | B1 | 7/2009 |
| KR | 1020100047797 | A | 5/2010 |
| KR | 101193703 | B1 | 10/2012 |
| KR | 101281210 | B1 | 6/2013 |
| KR | 101318075 | B1 | 10/2013 |
| KR | 1020190095878 | A | 8/2019 |
| KR | 1020200039068 | A | 4/2020 |
| WO | 2007067339 | A2 | 6/2007 |

* cited by examiner

PUMP, CHEMICAL LIQUID SUPPLYING UNIT, AND SUBSTRATE TREATING APPARATUS

CROSS-REFERENCE TO RELATED APPLICATIONS

This application claims priority to and the benefit of Korean Patent Application No. 10-2021-0116768 filed in the Korean Intellectual Property Office on Sep. 2, 2021, the entire contents of which are incorporated herein by reference.

TECHNICAL FIELD

The present invention relates to a pump and a chemical liquid supplying apparatus including the same.

BACKGROUND ART

In order to manufacture a semiconductor device or a liquid crystal display, various processes, such as photography, etching, ashing, ion implantation, thin film deposition, and cleaning, are performed on a substrate. Among them, in the photography, etching, ashing, and cleaning processes, a liquid treating process supplying a liquid onto the substrate is performed.

In general, the liquid treating process is a process for liquid-processing the substrate by discharging a processing liquid from a nozzle.

Various pumps are used for the chemical liquid supplying apparatus of the liquid processing process. Among them, the mini pump (Entegris, rolling diaphragm method) is difficult to be applied to micro process equipment (ArF, EUV equipment) because of its poor chemical liquid replacement rate and high possibility of causing particles by the stagnant photoresist (PR).

Another EPT pump (Korea Institute of Industrial Technology, jointly developed with Koganei, tube diaphragm method) requires a ball screw, LM guide, LM block, and the like for converting the rotational force of the motor into up-and-down moving force, which increases the size of the pump.

SUMMARY OF THE INVENTION

The present invention has been made in an effort to provide a pump capable of improving a chemical liquid replacement rate, a chemical liquid supplying unit, and a substrate treating apparatus.

The present invention has also been made in an effort to provide a pump with a decreased size, a chemical liquid supplying unit, and a substrate treating apparatus.

The problem to be solved by the present invention is not limited to the above-mentioned problems. The problems not mentioned will be clearly understood by those skilled in the art from the descriptions below.

An exemplary embodiment of the present invention provides a chemical liquid supply pump, including: a tube including a pump chamber communicating with a chemical liquid inlet and a chemical liquid outlet, and configured to discharge a chemical liquid through a change in volume due to contraction and expansion; and a driving unit contracting or expanding the tube in a longitudinal direction.

Further, a cross-section of the pump chamber may be provided in a shape of a jar in which a space becomes wider toward a center from the chemical liquid inlet and the chemical liquid outlet, and when the tube is contracted in the longitudinal direction by the driving unit, an internal volume of the pump chamber may be increased, and when the tube is expanded in the longitudinal direction, the internal volume of the pump chamber may be decreased.

Further, the tube may include: a flexible tube body having a jar shape of which a radius is increased from the chemical liquid inlet to a center of the pump chamber, and the radius is decreased from the pump chamber to the chemical liquid outlet; a first flange provided at one end of the tube body and including the chemical liquid inlet; and a second flange provided at the other end of the tube body and including the chemical liquid outlet.

Further, in the tube, any one of the first flange and the second flange may be connected to the driving unit, so that the tube body may be contracted and expanded by an operation of the driving unit.

Further, the chemical liquid supplying pump may further include a sealing case provided to surround the tube.

Further, the sealing case may be provided in a form of a bellows, and is provided to interlock with contraction and expansion operations of the tube.

Further, the sealing case may be filled with an incompressible fluid therein.

Further, the tube body may further include a valve for accelerating a circulation of the chemical liquid in the pump chamber.

Further, the valve may be provided in a form of an open center.

Further, a plurality of the tube bodies may be connected in series.

Further, the plurality of the tube bodies connected in series may be provided with different sizes from each other.

Further, the chemical liquid supplying pump may further include a torsion tube provided between the driving unit and the tube so as to be connected in series with the tube, and configured to discharge the chemical liquid through a change in volume due to torsion, in which the driving unit may transmit rotational force and vertical movement force to the torsion tube in order to contract and expand the tube while twisting the torsion tube.

Further, the torsion tube may include: a flexible torsion tube body; and a sealing case provided to surround the torsion tube body and filled with an incompressible fluid therein, and one end of the torsion tube body is connected to the tube, and the other end of the torsion tube body receives the rotational force and the vertical movement force from the driving unit.

Another exemplary embodiment of the present invention provides a chemical liquid supply pump including: a tube including a pump chamber communicating with a chemical liquid inlet and a chemical liquid outlet, and configured to discharge a chemical liquid through a change in volume due to contraction and expansion; and a driving unit contracting or expanding the tube in a longitudinal direction, in which the tube may include: a flexible tube body including a pump chamber which has an increased internal volume when is contracted in a longitudinal direction and has a decreased internal volume when is expanded in the longitudinal direction, and which has a jar shape of which a radius is increased from the chemical liquid inlet to a center of the pump chamber, and the radius is decreased from the pump chamber to the chemical liquid outlet; a first flange provided at one end of the tube body and including the chemical liquid inlet; and a second flange provided at the other end of the tube body and including the chemical liquid outlet.

Further, the chemical liquid supplying pump may further include a sealing case provided to surround the tube and filled with an incompressible fluid therein.

Further, the tube body may further include a valve for accelerating a circulation of the chemical liquid in the pump chamber, and the valve may be provided in a form of an open center.

Still another exemplary embodiment of the present invention provides a chemical liquid supplying apparatus, including: a pump for supplying a chemical liquid to a nozzle that discharges the chemical liquid to a substrate; a trap tank in which the chemical liquid to be supplied from the pump to the nozzle is temporarily stored; a bottle containing the chemical liquid stored in the trap tank; and a filter provided on a path through which the chemical liquid is supplied from the trap tank to the pump, in which the pump includes: a driving unit; and a first tube including a pump chamber communicating with a chemical liquid inlet and a chemical liquid outlet, and configured to discharge the chemical liquid while being contracted and expanded in a longitudinal direction by the driving unit, and when the tube is contracted in the longitudinal direction by the driving unit, an internal volume of the pump chamber is increased, and when the tube is expanded in the longitudinal direction, the internal volume of the pump chamber is decreased.

Further, the tube may include: a flexible tube body having a jar shape of which a radius is increased from the chemical liquid inlet to a center of the pump chamber, and the radius is decreased from the pump chamber to the chemical liquid outlet; a first flange provided at one end of the tube body and including the chemical liquid inlet; and a second flange provided at the other end of the tube body and including the chemical liquid outlet, and any one of the first flange and the second flange may be connected to the driving unit, so that the tube body may be contracted and expanded by an operation of the driving unit.

Further, the chemical liquid supplying apparatus may further include a sealing case provided to surround the tube, in which the sealing case may be provided in a form of a bellows, and be provided to interlock with contraction and expansion operations of the tube, and the sealing case may be filled with an incompressible fluid therein.

Further, the tube body may further include a valve for accelerating a circulation of the chemical liquid in the pump chamber, and the valve may be provided in a form of an open center.

Further, the pump may further include a torsion tube which is provided between the driving unit and the tube so as to be connected in series with the tube and discharges the chemical liquid through a change in volume due to torsion, and the driving unit may transmit rotational force and vertical movement force to the torsion tube in order to contract and expand the tube while twisting the torsion tube.

Further, the torsion tube may have a cross-section having a multi-leaf shape, and have a spirally twisted structure around a core.

According to the exemplary embodiment of the present invention, it is possible to improve a chemical liquid substitution rate.

According to the exemplary embodiment of the present invention, it is possible to minimize the stagnation of the chemical liquid in the tube.

According to the exemplary embodiment of the present invention, it is possible to decrease a size of the pump.

DETAILED DESCRIPTION

Advantages and characteristics, and a method for achieving them will be clear when exemplary embodiments described in detail with reference to the accompanying drawings are referred to. However, the present disclosure is not limited to exemplary embodiments disclosed herein but will be implemented in various forms, and the exemplary embodiments are provided so that the present disclosure is completely disclosed, and a person of ordinary skilled in the art can fully understand the scope of the present disclosure, and the present disclosure will be defined only by the scope of the appended claims.

Even if not defined, all terms (including technical or scientific terms) used herein have the same meaning as commonly accepted by common skill in the related art to which this invention belongs. Terms defined by the general dictionaries may be interpreted as having the same meaning as in the related art and/or in the text of the present application, and the terms will not be conceptualized or interpreted overly formal even if the term is not a clearly defined expression here. The terms used in the present specification is for the purpose of describing exemplary embodiments, and do not intend to limit the present invention.

In the present specification, a singular form includes a plural form as well, unless otherwise mentioned. A term "include" and/or various conjugations of this verb do not exclude the existence or an addition of one or more other compositions, components, constituent elements, steps, operations, and/or devices, in addition to the mentioned composition, component, constituent element, step, operation, and/or device. Further, "is provided", "have", and the like should be interpreted in the same way.

The equipment of the present exemplary embodiment is described as being used to perform a photolithography process on a substrate, such as a semiconductor wafer or a flat panel display panel, but this is for convenience of description and the present invention may also be used for other apparatuses using a pump for supplying a chemical liquid to treat a substrate.

Hereinafter, an exemplary embodiment of the present invention will be described with reference to FIGS. 1 to 23.

Figure 1:
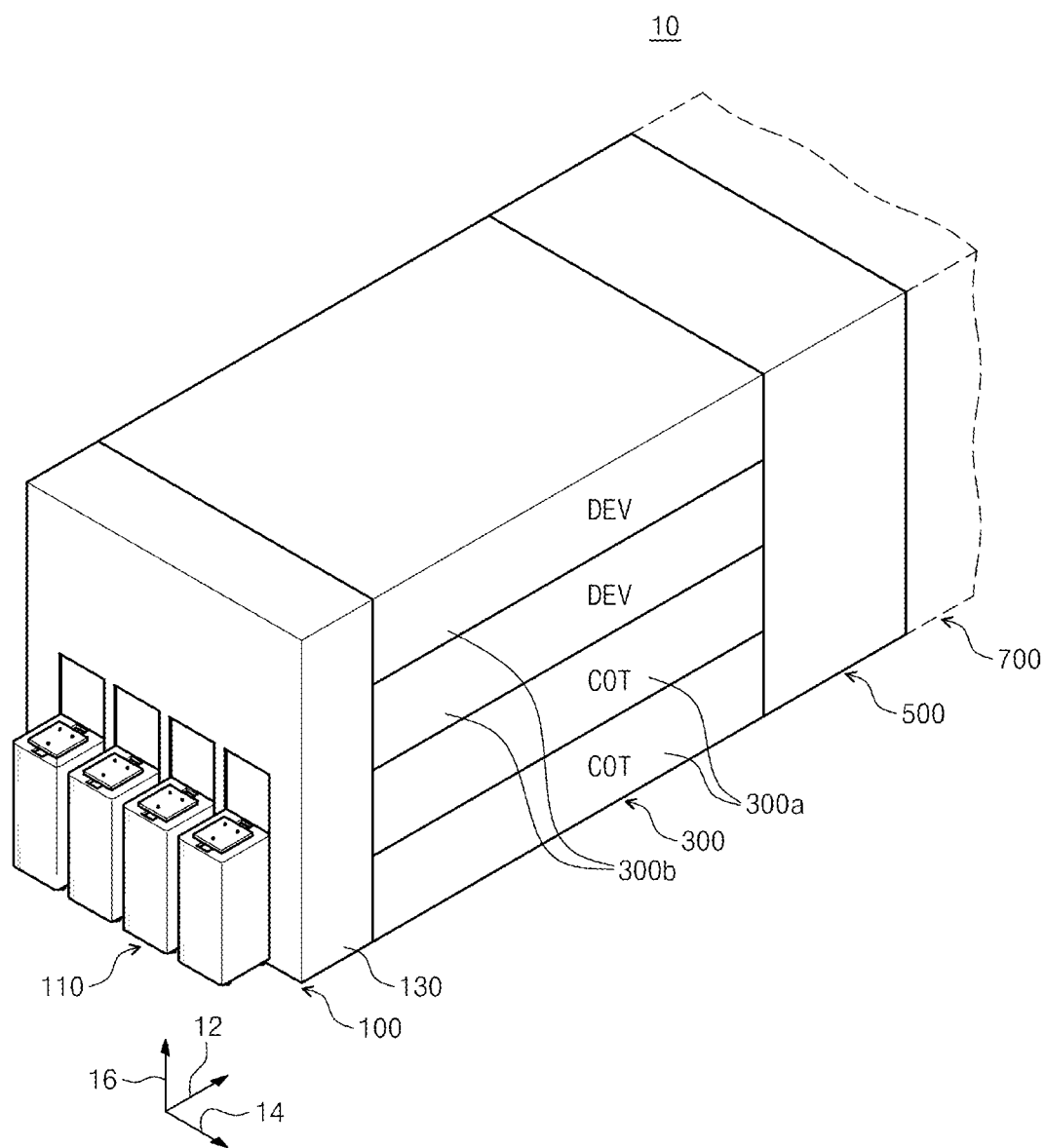
FIG. 1 is a perspective view schematically illustrating a substrate treating apparatus according to an exemplary embodiment of the present invention.
Figure 2:
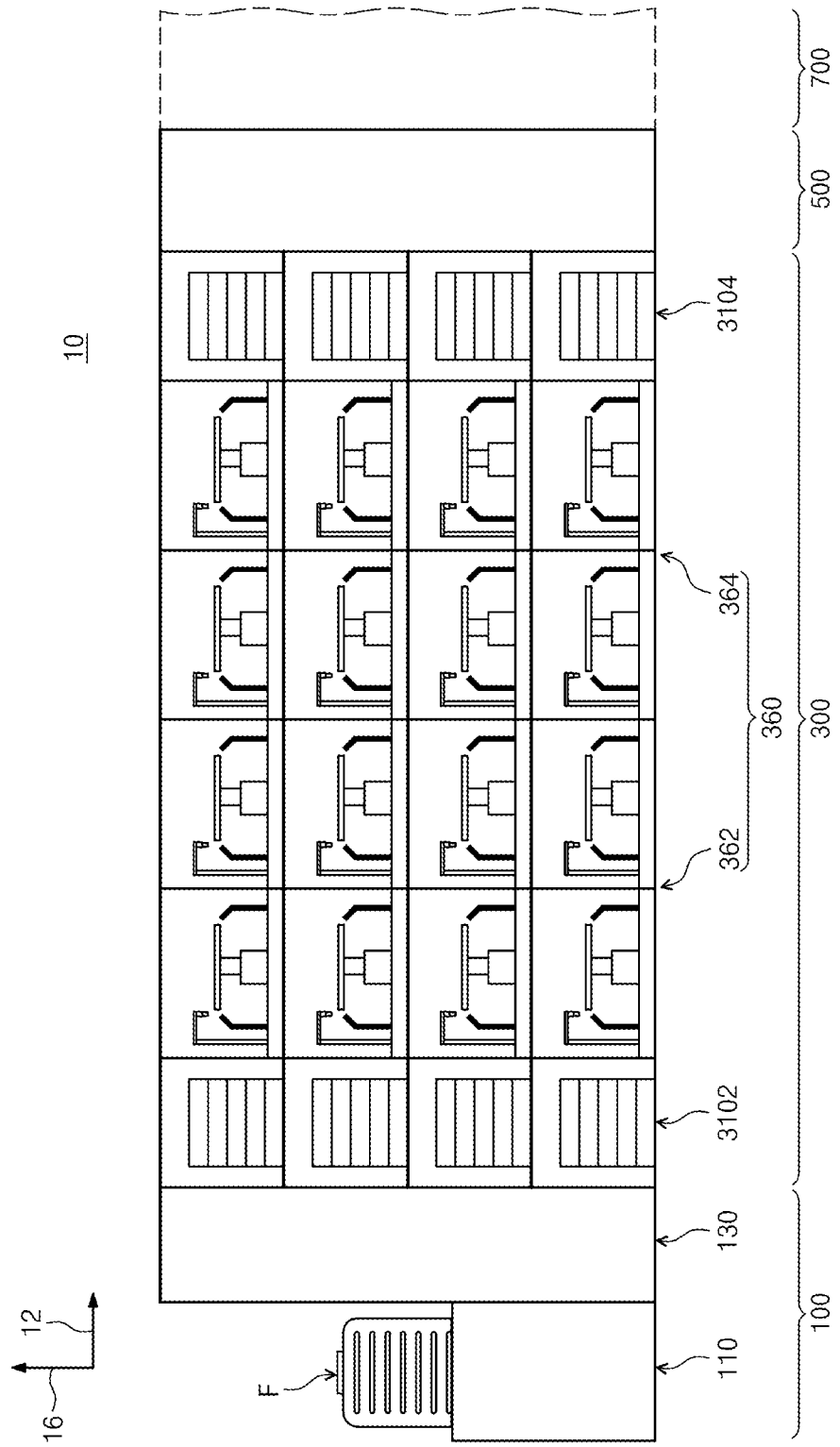
FIG. 2 is a cross-sectional view illustrating a coating block or a developing block of the substrate treating apparatus of FIG. 1.
Figure 3:
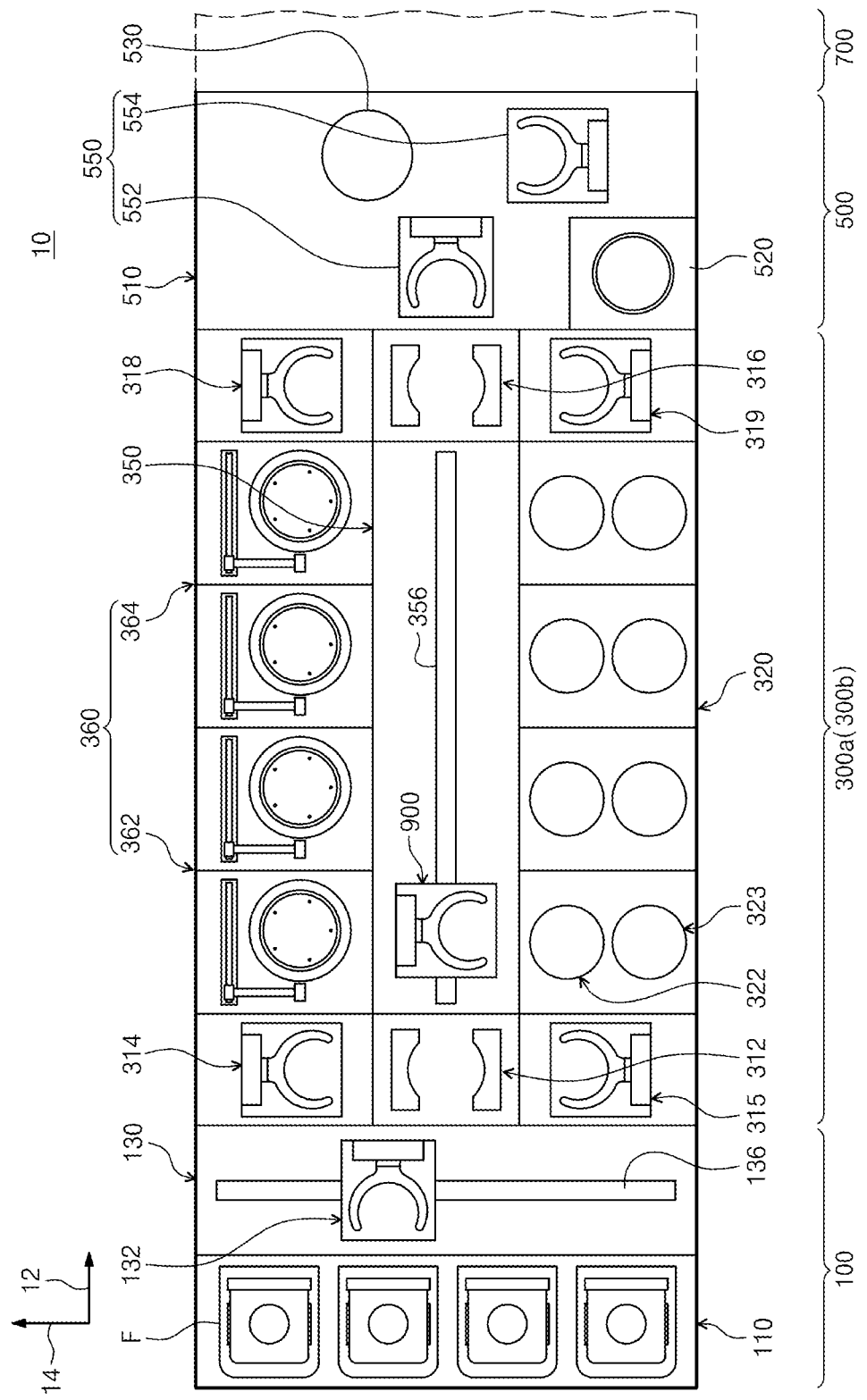
FIG. 3 is a top plan view of the substrate treating apparatus of FIG. 1.

FIG. 1 is a perspective view schematically illustrating a substrate treating apparatus according to an exemplary embodiment of the present invention, FIG. 2 is a cross-sectional view of a coating block or a developing block of the substrate treating apparatus illustrating of FIG. 1, and FIG. 3 is a top plan view of the substrate treating apparatus of FIG. 1.

Referring to FIGS. 1 to 3, a substrate treating apparatus 10 according to the exemplary embodiment of the present invention includes an index module 100, a processing module 300, and an interface module 500.

According to the exemplary embodiment, the index module 100, the processing module 300, and the interface module 500 are sequentially arranged in a line. Hereinafter, the direction in which the index module 100, the processing module 300, and the interface module 500 are arranged is called a first direction 12, and when viewed from the top, a direction perpendicular to the first direction 12 is defined as a second direction 14, and a direction perpendicular to both the first direction 12 and the second direction 14 is defined as a third direction 16.

The index module 100 transfers a substrate W to the processing module 300 from a container F in which the substrate W is accommodated, and receives the completely treated substrate W into the container F. A longitudinal direction of the index module 100 is provided in the second direction 14. The index module 100 includes a load port 110 and an index frame 130. With respect to the index frame 130, the load port 110 is located on the opposite side of the processing module 300. The container F in which the substrates W are accommodated is placed on the load port 110. A plurality of load ports 110 may be provided, and the plurality of load ports 110 may be disposed along the second direction 14.

As the container F, an airtight container F, such as a Front Open Unified Pod (FOUP), may be used. The container F may be placed on the load port 110 by a transfer means (not illustrated), such as an overhead transfer, an overhead conveyor, or an automatic guided vehicle, or an operator.

An index robot 132 is provided inside the index frame 130. A guide rail 136 of which a longitudinal direction is provided in the second direction 14 is provided within the index frame 130, and the index robot 132 may be provided to be movable on the guide rail 136. The index robot 132 includes a hand on which the substrate W is placed, and the hand is provided to be movable forward and backward, rotatable about the third direction 16, and movable in the third direction 16.

The processing module 300 may perform a coating process and a developing process on the substrate W. The processing module 300 may receive the substrate W accommodated in the container F and perform a substrate treating process. The processing module 300 includes an applying block 300a and a developing block 300b. The costing block 300a performs an application process on the substrate W, and the developing block 300b performs a developing process on the substrate W. A plurality of coating blocks 300a is provided, and the coating blocks 300a are provided to be stacked on each other. A plurality of developing blocks 300b is provided, and the developing blocks 300b are provided to be stacked on each other. According to the exemplary embodiment of FIG. 1, two coating blocks 300a and two developing blocks 300b are provided respectively. The coating blocks 300a may be disposed under the developing blocks 300b. According to an example, the two coating blocks 300a perform the same process, and may be provided in the same structure. Further, the two developing blocks 300b may perform the same process and may be provided in the same structure.

Referring to FIG. 3, the coating block 300a includes a heat treating chamber 320, a transfer chamber 350, a liquid processing chamber 360, and buffer chambers 312 and 316. The heat treating chamber 320 performs a heat treatment process on the substrate W. The heat treatment process may include a cooling process and a heating process. The liquid processing chamber 360 supplies a liquid onto the substrate W to form a liquid film. The liquid film may be a photoresist film or an antireflection film. The transfer chamber 350 transfers the substrate W between the heat treating chamber 320 and the liquid processing chamber 360 in the coating block 300a.

The transfer chamber 350 is provided so that a longitudinal direction thereof is parallel to the first direction 12. The transfer robot 350 is provided to the transfer chamber 900. The transfer robot 352 transfers the substrate between the heat processing chamber 320, the liquid processing chamber 360, and the buffer chambers 312 and 316. According to an example, the transfer robot 900 includes a hand on which the substrate W is placed, and the hand may be provided to be movable forward and backward, rotatable about the third direction 16, and movable in the third direction 16. A guide rail 356, of which a longitudinal direction is parallel to the first direction 12, is provided within the transfer chamber 350, and the transfer robot 900 may be provided to be movable on the guide rail 356.

Figure 4:
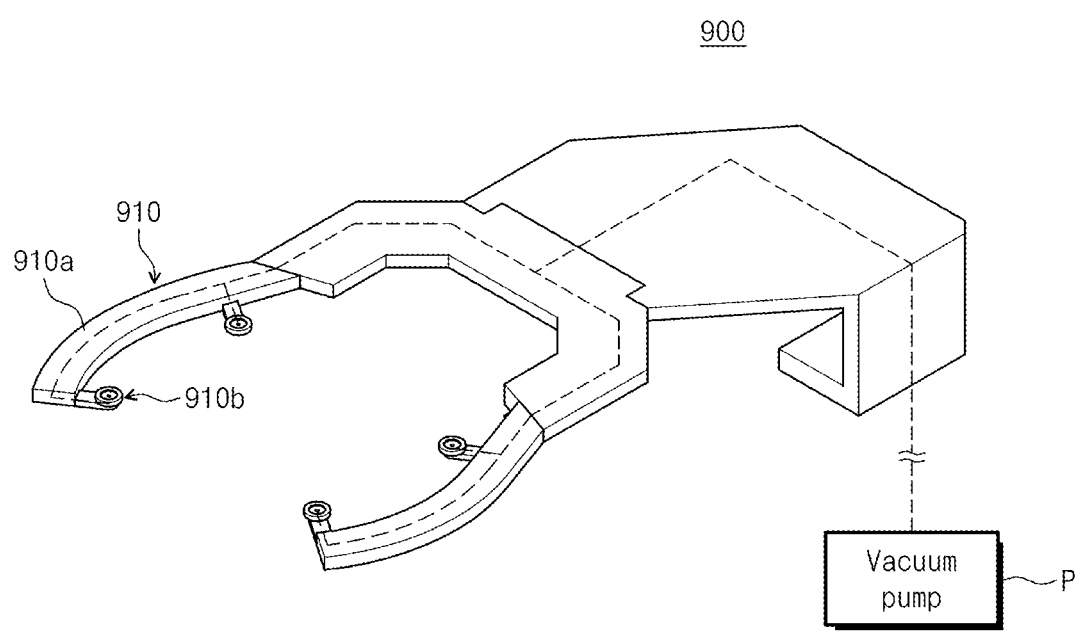
FIG. 4 is a diagram illustrating an example of a hand of a transfer robot.

FIG. 4 is a diagram illustrating an example of a hand of a transfer robot.

Referring to FIG. 4, a hand 910 includes a hand main body 910a and support fingers 910b. The hand main body 910a is formed in a substantially horseshoe shape having an inner diameter greater than the diameter of the substrate. However, the shape of the hand main body 910a is not limited thereto. In four places including the leading end of the hand main body 910a, the support fingers 910b are installed inwardly. The hand main body 910a has a vacuum flow path (not illustrated) formed therein. A vacuum flow path (not illustrated) is connected to a vacuum pump through a vacuum line.

Referring back to FIGS. 1 to 3, a plurality of heat treating chambers 320 is provided. The heat treating chambers 320 are disposed along the first direction 12. The heat treating chambers 320 are located at one side of the transfer chamber 350.

Figure 5:
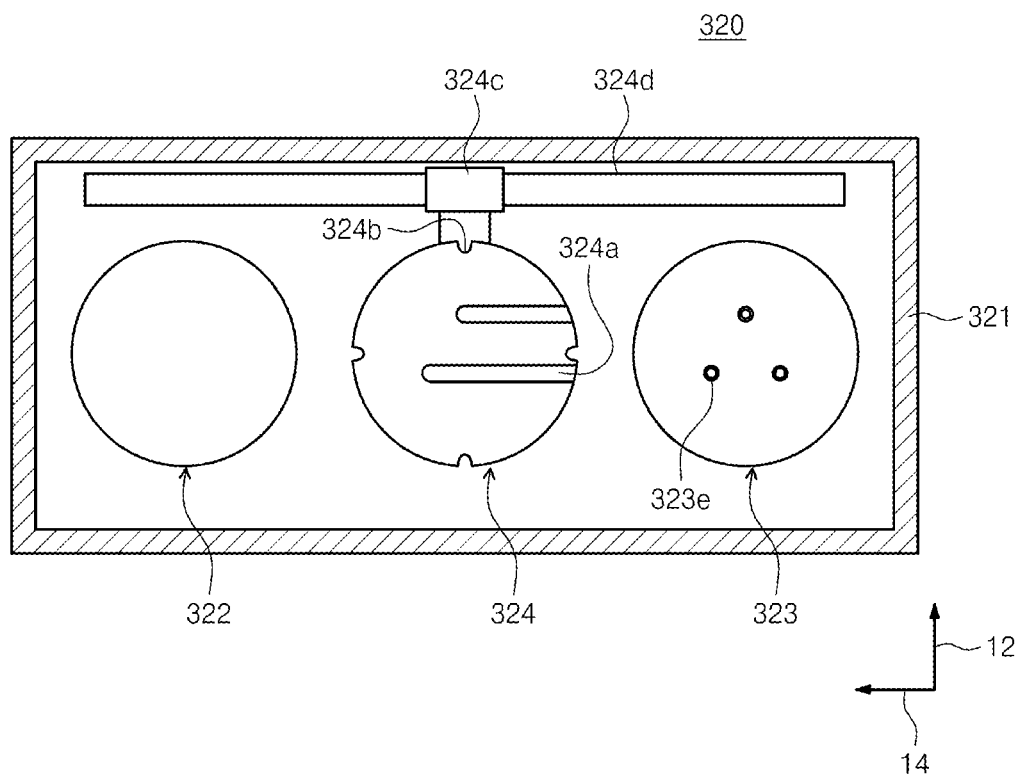
FIG. 5 is a top plan view schematically illustrating an example of a heat treating chamber of FIG. 3.
Figure 6:
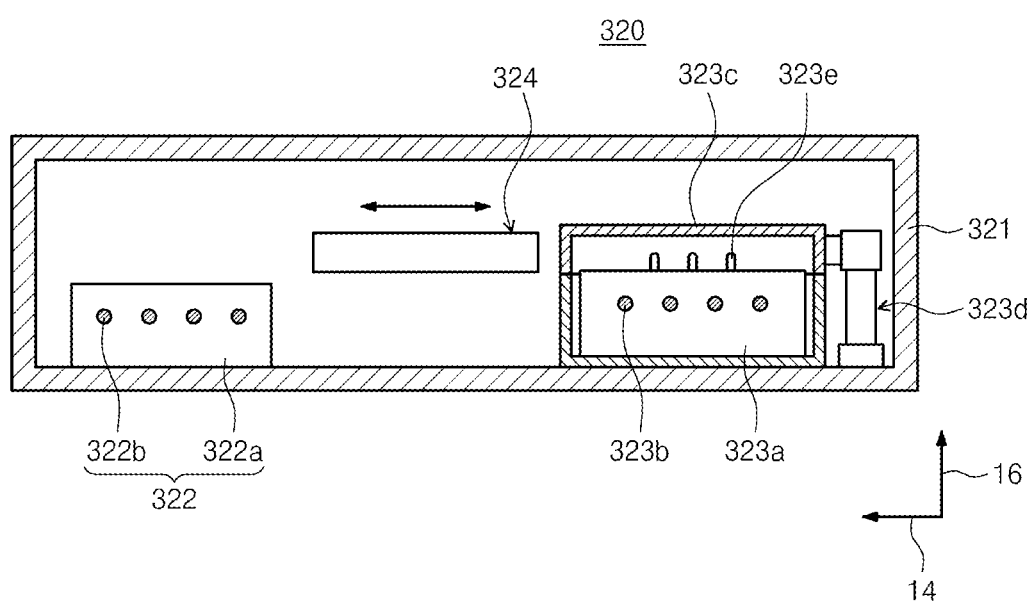
FIG. 6 is a front view of the heat treating chamber of FIG. 5.

FIG. 5 is a top plan view schematically illustrating an example of the heat treating chamber of FIG. 3, and FIG. 6 is a front view of the heat treating chamber of FIG. 5.

Referring to FIGS. 5 and 6, the heat treating chamber 320 includes a housing 321, a cooling unit 322, a heating unit 323, and a transfer plate 324.

The housing 321 is provided in the shape of a generally rectangular parallelepiped. An entrance (not illustrated) through which the substrate W enters and exits is formed on the sidewall of the housing 321. The entrance may remain open. Optionally, a door (not illustrated) may be provided to open and close the entrance. The cooling unit 322, the heating unit 323, and the transfer plate 324 are provided inside the housing 321. The cooling unit 322 and the heating unit 323 are arranged along the second direction 14. According to an example, the cooling unit 322 may be located closer to the transfer chamber 350 than the heating unit 322.

The cooling unit 322 has a cooling plate 322a. The cooling plate 322a may have a generally circular shape when viewed from the top. The cooling plate 322a is provided with a cooling member 322b. According to an example, the cooling member 322b is formed inside the cooling plate 322a and may be provided as a flow path through which the cooling fluid flows.

The heating unit 323 includes a heating plate 323a, a cover 323c, and a heater 323b. The heating plate 323a has a generally circular shape when viewed from the top. The heating plate 323a has a larger diameter than the substrate W. The heater 323b is installed on the heating plate 323a. The heater 323b may be provided as a heating resistor to which current is applied. The heating plate 323a is provided with lift pins 323e drivable in the vertical direction along the third direction 16. The lift pin 323e receives the substrate W from a transfer means outside the heating unit 323 and places the received substrate W on the heating plate 323a or lifts the substrate W from the heating plate 323a and hands over the substrate W to the external transfer means. According to the example, three lift pins 323e may be provided. The cover 323c has a space with an open lower portion therein.

The cover 323c is located above the heating plate 323a and is moved in a vertical direction by a driver 3236d. The space formed by the cover 323c and the heating plate 323a according to the movement of the cover 323c is provided as a heating space for heating the substrate W.

The transfer plate 324 is provided in a substantially disk shape, and has a diameter corresponding to that of the substrate W. A notch 324b is formed at an edge of the transfer plate 324. The notch 324b may have a shape corresponding to a protrusion 3543 formed on the hand 354 of the transfer robot 352 described above. In addition, the notches 324b are provided in a number corresponding to the number of protrusions 3543 formed on the hand 354, and are formed at positions corresponding to the protrusions 3543. When the upper and lower positions of the hand 354 and the transfer plate 324 are changed in the position where the hand 354 and the transfer plate 324 are aligned in the vertical direction, the substrate W is transferred between the hand 354 and the transfer plate 324. The transfer plate 324 is mounted on a guide rail 324d and may be moved between a first area 3212 and a second area 3214 along the guide rail 324d by a driver 324c. A plurality of slit-shaped guide grooves 324a is provided in the transfer plate 324. The guide groove 324a extends from the end of the transfer plate 324 to the inside of the transfer plate 324. The longitudinal direction of the guide grooves 324a is provided along the second direction 14, and the guide grooves 324a are spaced apart from each other along the first direction 12. The guide groove 324a prevents the transfer plate 324 and the lift pins 323e from interfering with each other when the substrate W is transferred between the transfer plate 324 and the heating unit 323.

The substrate W is cooled in the state where the transfer plate 324 on which the substrate W is placed is in contact with the cooling plate 322a. The transfer plate 324 is made of a material having high thermal conductivity so that heat transfer is well performed between the cooling plate 322a and the substrate W. According to the example, the transfer plate 324 may be made of a metal material.

The heating units 323 provided in some of the heat treating chambers 320 may supply a gas while heating the substrate W to improve the adhesion rate of the photoresist to the substrate. According to the example, the gas may be hexamethyldisilane (HMDS) gas.

Referring back to FIGS. 1 to 3, a plurality of liquid processing chambers 360 is provided. Some of the liquid processing chambers 360 may be provided to be stacked on each other. The liquid processing chambers 360 are disposed at one side of the transfer chamber 350. The liquid processing chambers 360 are arranged side by side along the first direction 12. Some of the liquid processing chambers 360 are provided at positions adjacent to the index module 100. Hereinafter, the liquid processing chambers 360 located to be adjacent to the index module 100 are referred to as front liquid processing chambers 362. Another some of the liquid processing chambers 360 are provided at positions adjacent to the interface module 500. Hereinafter, the liquid processing chambers 360 located to be adjacent to the interface module 500 are referred to as rear liquid processing chambers 364.

The front liquid processing chamber 362 applies a first liquid onto the substrate W, and the rear liquid processing chamber 284 applies a second liquid onto the substrate W. The first liquid and the second liquid may be different types of liquid. According to the exemplary embodiment, the first liquid is an antireflection film, and the second liquid is a photoresist. The photoresist may be applied onto the substrate W coated with the antireflection film. Optionally, the first liquid may be a photoresist, and the second liquid may be an antireflection film. In this case, the antireflection film may be applied onto the substrate W coated with the photoresist. Optionally, the first liquid and the second liquid are the same type of liquid, and both the first liquid and the second liquid may be the photoresist.

The developing block 300b has the same structure as the coating block 300a, and the liquid processing chamber provided in the developing block 300b supplies a developer onto the substrate. The interface module 500 connects the processing module 300 to an external exposing device 700. The interface module 500 includes an interface frame 510, an additional process chamber 520, an interface buffer 530, and an interface robot 550.

A fan filter unit for forming a descending airflow therein may be provided at an upper end of the interface frame 510. The additional process chamber 520, the interface buffer 530, and the interface robot 550 are disposed inside the interface frame 510. The additional process chamber 340 may perform a predetermined additional process before the substrate W, which has been completely treated in the coating block 300a, is loaded into the exposing device 700. Optionally, the additional process chamber 520 may perform a predetermined additional process before the substrate W, which has been completely processed in the exposing device 700, is loaded into the developing block 300b. According to one example, the additional process may be an edge exposure process of exposing an edge region of the substrate W, a top surface cleaning process of cleaning the upper surface of the substrate W, or a lower surface cleaning process of cleaning the lower surface of the substrate W. A plurality of additional process chambers 520 is provided, and may be provided to be stacked on each other. All of the additional process chambers 520 may be provided to perform the same process. Optionally, a part of the additional process chambers 520 may be provided to perform different processes.

The interface buffer 530 provides a space in which the substrate W transferred between the coating block 300a, the additional process chamber 520, the exposing device 700, and the developing block 300b temporarily stays during the transfer. A plurality of interface buffers 530 may be provided, and the plurality of interface buffers 530 may be provided to be stacked on each other.

According to the example, the additional process chamber 520 may be disposed on one side of the transfer chamber 350 based on an extended line in the longitudinal direction and the interface buffer 530 may be disposed on the other side thereof.

The interface robot 550 transfers the substrate W between the applying block 300a, the additional process chamber 520, the exposing device 700, and the developing block 300b. The interface robot 550 may have a transfer hand that transfers the substrate W. The interface robot 550 may be provided as one or a plurality of robots. According to the example, the interface robot 550 has a first robot 552 and a second robot 554. The first robot 552 may be provided to transfer the substrate W between the coating block 300a, the additional process chamber 520, and the interface buffer 530, and the second robot 554 may be provided to transfer the substrate W between the interface buffer 530 and the exposing device 700, and the second robot 554 may be provided to transfer the substrate W between the interface buffer 530 and the developing block 300b.

The first robot 552 and the second robot 554 each include a transfer hand on which the substrate W is placed, and the hand may be provided to be movable forward and backward, rotatable about an axis parallel to the third direction 16, and movable along the third direction 16.

Hereinafter, the structure of the liquid processing chamber will be described in detail. Hereinafter, the liquid processing chamber provided in the coating block will be described as an example. In addition, the liquid processing chamber will be described based on the case of a chamber for applying the photoresist onto the substrate as an example. However, the liquid processing chamber may be a chamber in which a film, such as a protective film or an antireflection film, is formed on the substrate W. In addition, the liquid processing chamber may be a chamber for developing the substrate W by supplying a developer to the substrate W.

Figure 7:
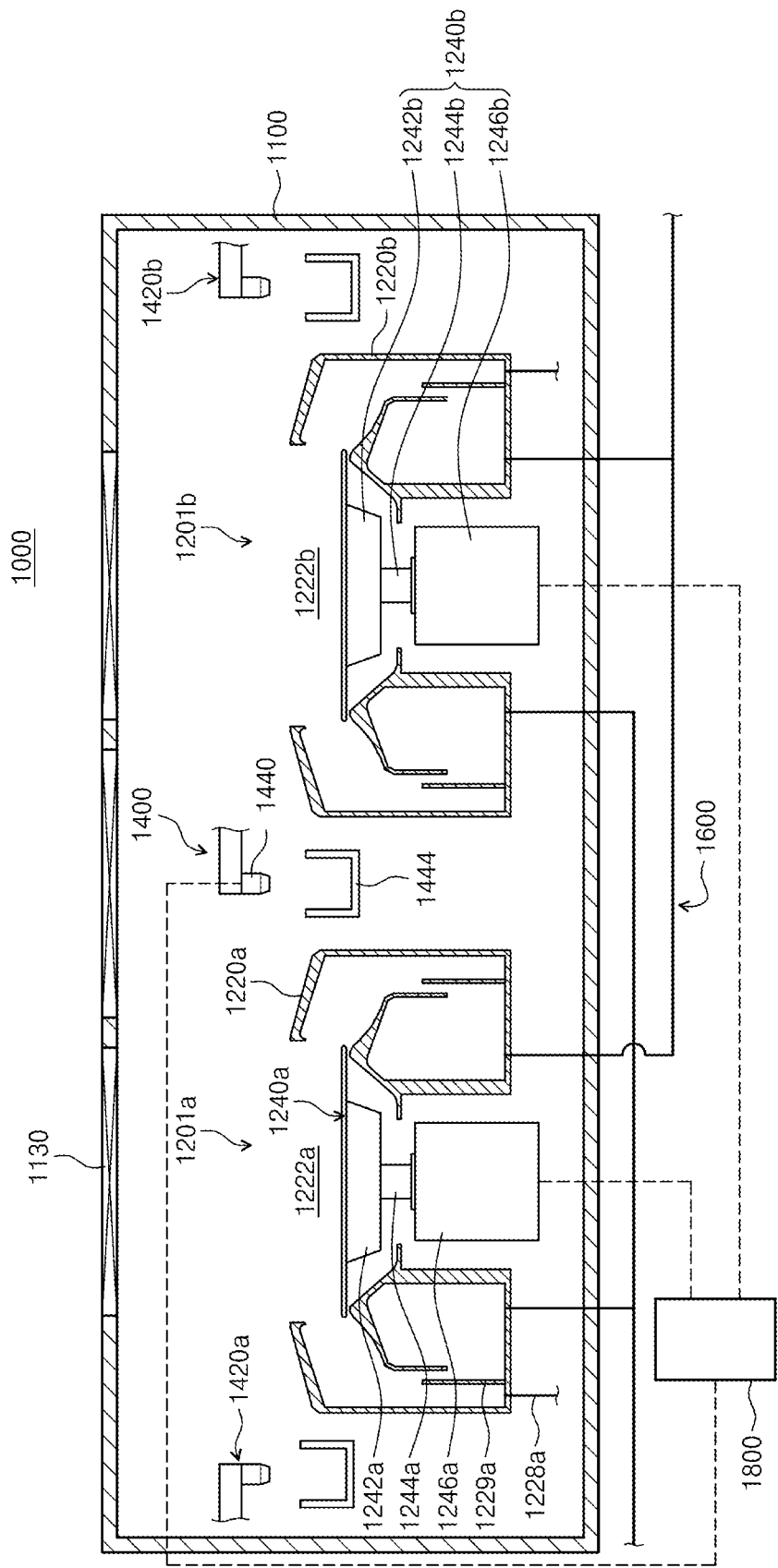
FIG. 7 is a cross-sectional view illustrating an exemplary embodiment of a liquid processing chamber for liquid-processing a substrate W by supplying a processing liquid to a rotating substrate W.
Figure 8:
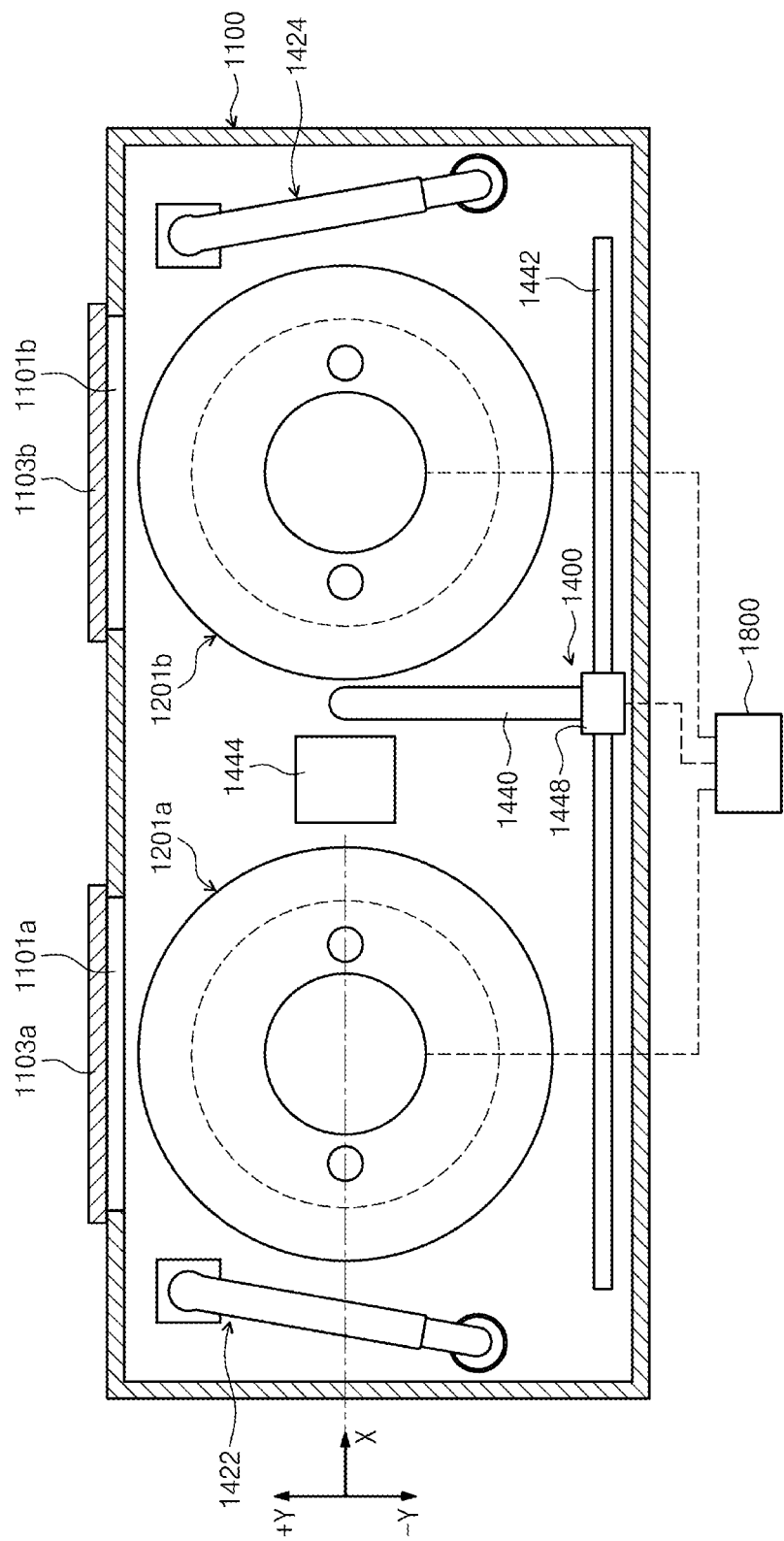
FIG. 8 is a top plan view of the liquid processing chamber of FIG. 7.

FIG. 7 is a cross-sectional view illustrating an exemplary embodiment of the liquid processing chamber for liquid-processing the substrate W by supplying a processing liquid to a rotating substrate W, and FIG. 8 is a top plan view of the liquid processing chamber of FIG. 7.

Referring to FIGS. 7 and 8, the liquid processing chamber 1000 includes a housing 1100, a first processing unit 1201a, a second processing unit 1201b, a liquid supply unit 1400, an exhaust unit 1600, and a controller 1800.

The housing 1100 is provided in a rectangular cylindrical shape having an inner space. Openings 1101a and 1101b are formed at one side of the housing 1100. The openings 1101a and 1101b function as passages through which the substrate W is loaded in and out. Doors 1103a and 1103b are installed in the openings 1101a and 1101b, and the doors 1103a and 1103b open and close the openings 1101a and 1101b.

A fan filter unit 1130 is disposed on the upper wall of the housing 1100 to supply a descending airflow into the inner space. The fan filter unit 1130 includes a fan for introducing external air into the inner space and a filter for filtering external air.

The first processing unit 1201a and the second processing unit 1201b are provided in the inner space of the housing 1100. The first processing unit 1201a and the second processing unit 1201b are arranged along one direction. Hereinafter, a direction in which the first processing unit 1201a and the second processing unit 1201b are arranged is referred to as a unit arrangement direction, and is illustrated in the X-axis direction in FIG. 11.

The first processing unit 1201a has a first processing container 1220a and a first support unit 1240a.

The first processing container 1220a has a first inner space 1222a. The first inner space 1222a is provided with an open top.

The first support unit 1240a supports the substrate W in the first inner space 1222a of the first processing container 1220a. The first support unit 1240a includes a first support plate 1242a, a first driving shaft 1244a, and a first driver 1246a. The first supporting plate 1242a has a circular top surface. The first support plate 1242a has a smaller diameter than that of the substrate W. The first support plate 1242a is provided to support the substrate W by vacuum pressure. Optionally, the first support plate 1242a may have a mechanical clamping structure for supporting the substrate W. A first driving shaft 1244a is coupled to the center of the bottom surface of the first support plate 1242a, and a first driver 1246a for providing rotational force to the first driving shaft 1244a is provided to the first driving shaft 1244a. The first driver 1246a may be a motor.

The second processing unit 1201b includes a second processing container 1220b and a second support unit 1240b, and the second support unit 1240b includes a second support plate 1242b, a second driving shaft 1244b, and a second driver 1246b. The second processing container 1220b and the second supporting unit 1240b have substantially the same structure as the first processing container 1220a and the first supporting unit 1240a.

The liquid supply unit 1400 supplies the liquid onto the substrate W. The liquid supply unit 1400 includes a first nozzle 1420a, a second nozzle 1420b, and a processing liquid nozzle 1440. The first nozzle 1420a supplies a liquid to the substrate W provided to the first support unit 1240a, and the second nozzle 1420b supplies a liquid to the substrate W provided to the second support unit 1240b. The first nozzle 1420a and the second nozzle 1420b may be provided to supply the same type of liquid. According to the example, the first nozzle 1420a and the second nozzle 1420b may supply a rinse liquid for cleaning the substrate W. For example, the rinse liquid may be water. According to another example, the first nozzle 1420a and the second nozzle 1420b may supply a removal liquid for removing the photoresist from the edge region of the substrate W. For example, the removal liquid may be a thinner. Each of the first nozzle 1420a and the second nozzle 1420b may be rotated between a process position and a standby position about a rotation axis thereof. The process position is a position at which the liquid is discharged onto the substrate W, and the standby position is a position at which the first nozzle 1420*a* and the second nozzle 1420*b* stand by without discharging the liquid onto the substrate W.

The processing liquid nozzle 1440 supplies the processing liquid to the substrate W provided to the first support unit 1240*a* and the substrate W provided to the second support unit 1240*b*. The treatment solution may be a photoresist. The nozzle driver 1448 drives the processing liquid nozzle 1440 so that the processing liquid nozzle 1440 moves between a first process position, the standby position, and a second process position along a guide 1442. The first process position is a position for supplying the processing liquid to the substrate W supported by the first support unit 1240*a*, and the second process position is a position for supplying the processing liquid to the substrate W supported by the second support unit 1240*b*. The standby position is a position in which the nozzle waits the standby port 1444 located between the first processing unit 1201*a* and the second processing unit 1201*b* when the photoresist is not discharged from the processing liquid nozzle 1440.

A gas-liquid separation plate 1229*a* may be provided in the inner space 1201*a* of the first processing container 1220*a*. The gas-liquid separation plate 1229*a* may be provided to extend upwardly from the bottom wall of the first processing container 1220*a*. The gas-liquid separation plate 1229*a* may be provided in a ring shape.

According to the example, the outside of the gas-liquid separation plate 1229*a* may be provided as a discharging space for discharging the liquid, and the inside of the gas-liquid separation plate 1229*a* may be provided as an exhaust space for exhausting the atmosphere. A discharge pipe 1228*a* for discharging the processing liquid is connected to the bottom wall of the first processing container 1220*a*. The discharge pipe 1228*a* discharges the processing liquid introduced between the sidewall of the first processing container 1220*a* and the gas-liquid separation plate 1229*a* to the outside of the first processing container 1220*a*. The airflow flowing into the space between the sidewall of the first processing container 1220*a* and the gas-liquid separation plate 1229*a* is introduced into the gas-liquid separation plate 1229*a*. In this process, the processing liquid contained in the airflow is discharged from the discharging space to the outside of the first processing container 1220*a* through the discharge pipe 1228*a*, and the airflow is introduced into the exhaust space of the first processing container 1220*a*.

Although not illustrated, a lift driver for adjusting the relative height of the first support plate 1242*a* and the first processing container 1220*a* may be provided.

Figure 9:
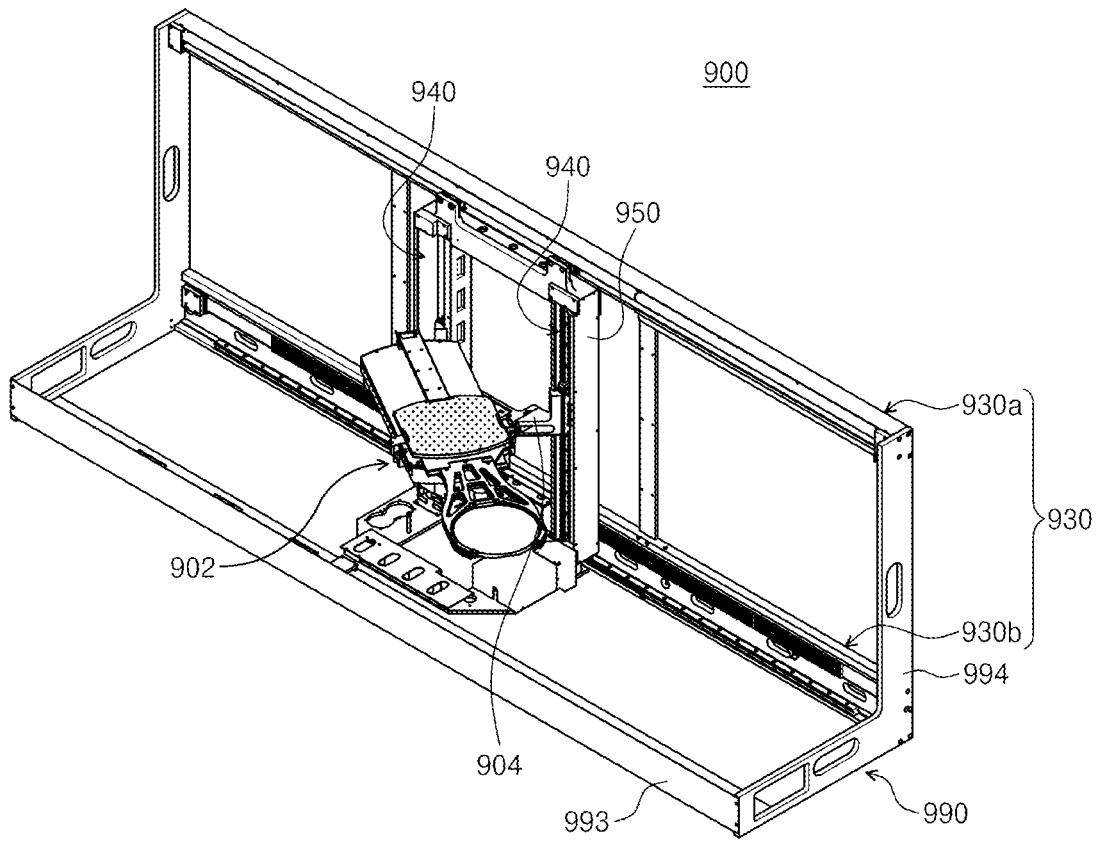
FIG. 9 is a perspective view illustrating an example of the transfer robot of FIG. 3.

FIG. 9 is a perspective view illustrating an example of the transfer robot of FIG. 3.

Hereinafter, the present invention will be described based on the case where a robot 900 of FIG. 9 is the transfer robot of FIG. 3. However, unlike this, the transfer robot may be an index robot, and may optionally be another robot provided in the substrate treating apparatus 10.

Referring to FIG. 9, the transfer robot 900 may include a robot main body 902, a horizontal driving unit 930, and a vertical driving unit 940.

The robot main body 902 may include a hand 910 capable of moving forward and backward (X direction) and rotating (θ direction) while supporting the substrate, and a hand driving unit 920 including a base supporting the hand 910.

The hand driving unit 920 horizontally moves the hands 910, and the hands 910 are individually driven by the hand driving unit 920. The hand driving unit 920 includes a connecting arm 912 connected to an internal driving unit (not illustrated), and the hand 910 is installed at an end of the connecting arm 912. In the present exemplary embodiment, the transfer robot 900 includes two hands 910, but the number of hands 910 may increase according to the process efficiency of the substrate treating apparatus 10. A rotating unit (not illustrated) is installed under the hand driving unit 920. The rotating unit is coupled to the hand driving unit 920 and rotates to rotate the hand driving unit 920. Accordingly, the hands 910 rotate together.

The horizontal driving unit 930 and the vertical driving unit 940 are mounted on one body frame 990.

The body frame 990 may be provided in a form in which several frames are coupled to each other. The body frame 990 may include an upper horizontal driving unit 930*a* and a lower horizontal driving unit 930*b* for guiding the robot main body in the Y direction, a vertical auxiliary frame 992 erected in the vertical direction between the upper and lower horizontal driving units 930*a* and 930*b*, a horizontal auxiliary frame 993 extending in parallel to the lower horizontal driving unit 930*b* to form the body frame 990, an auxiliary frame 994 for coupling the upper and lower horizontal driving units 930*a* and 930*b* and the ends of the horizontal auxiliary frame 993 to each other to form a side shape of the body frame 990.

In this way, since the body frame 990 is coupled by a plurality of auxiliary frames 992, 993, and 994, the rigidity of the body frame 990 is strengthened, and thus durability is enhanced, such as being able to maintain the shape thereof completely even when used for a long time.

As described above, the horizontal driving units 930*a* and 930*b* are traveling guides for moving the robot main body 902 in the Y direction, and are coupled to both leading ends of the vertical driving unit 940. Among the horizontal driving units 930*a* and 930*b*, in particular, a horizontal driving unit (not illustrated) including a transfer belt is built in the inner surface of the lower horizontal driving unit 930*b*. Accordingly, the robot main body 902 is horizontally moved along the horizontal driving unit 930*a* and 930*b* by the driving of the transfer belt.

The vertical driving unit 940 is a type of traveling driving unit moving the robot main body 902 in the Z direction, and is coupled to the horizontal driving units 930*b* and 930*a*. Accordingly, the robot main body 902 may be guided by the horizontal driving units 930*b* and 930*a* to move in the Y direction, and at the same time be guided by the vertical driving unit 940 to move in the Z direction. That is, the robot body 902 may be moved in an oblique direction corresponding to the sum of the Y direction and the Z direction.

On the other hand, the vertical driving unit 940 is formed of a plurality of frames, for example, two vertical frames, which are spaced apart from each other, so that the robot body 902 may freely enter and exit the space between the two frames.

A vertical driving unit (hereinafter referred to as a vertical driving unit) including a transfer belt is built in the vertical frame 950 of the vertical driving unit 940.

Figure 10:
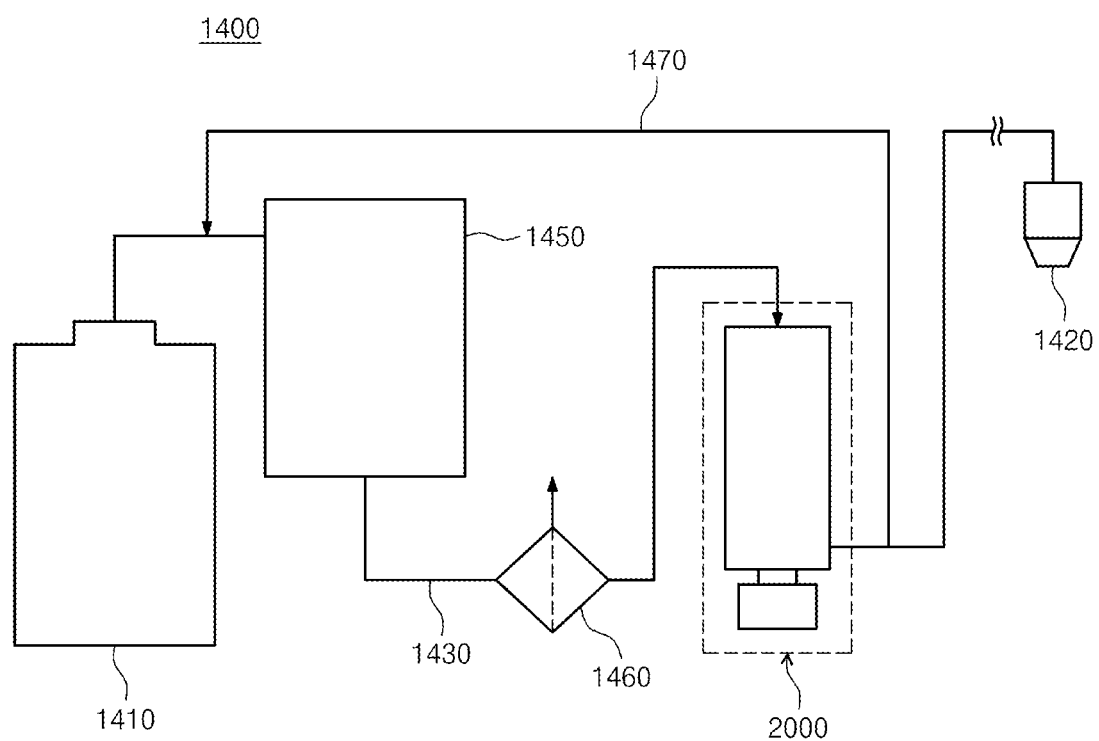
FIG. 10 is a configuration diagram illustrating the liquid supply unit.

FIG. 10 is a configuration diagram illustrating the liquid supply unit.

Referring to FIG. 10, the liquid supply unit 1400 includes a nozzle 1420, a liquid receiving member 1410, a liquid supply line 1430, a trap tank 1450, a pump 2000, a filter 1460, and a purge line 1470. Here, the nozzle may include a first nozzle 1420*a*, a second nozzle 1420*b*, and a processing liquid nozzle 1440 illustrated in FIG. 7.

The liquid supply line 1430 connects the nozzle 1420 and the liquid receiving member 1410. In the liquid supply line 1430, a trap tank 1450, a pump 2000, and a filter 1460 are installed between the nozzle 1420 and the liquid receiving member 1410. The liquid receiving member 1410 has a receiving space in which the processing liquid is accommodated. The liquid receiving member 1410 may be a bottle in which the processing liquid is accommodated. The processing liquid may be a photoresist containing fluorine (F).

In the trap tank 1450, bubbles of the processing liquid flowing through the liquid supply line 1430 may be removed. The trap tank 1450 is positioned between the nozzle 1420 and the liquid receiving member 1410 in the liquid supply line 1430.

The pump 2000 pressurizes the liquid supply line 1430 so that the processing liquid flowing through the liquid supply line 1430 is supplied in a direction toward the nozzle 1420. The pump 2000 is located downstream the trap tank 1450 in the liquid supply line 1430. According to the example, the pump 2000 may discharge the processing liquid in the tube through a change in volume due to contraction and expansion of the tube.

The filter 1500 filters impurities in the processing liquid flowing through the liquid supply line 1200. The filter 1500 is positioned between the trap tank 1300 and the pump 2000 in the liquid supply line 1200. The filter 1500 may be located closer to the pump 2000 than the trap tank 1300 in the liquid supply line 1200. In the process of passing the processing liquid through the filter 1500, impurities are filtered.

The purge line 1470 is connected to the liquid supply line 1200 so that the processing liquid that has passed through the pump 2000 is returned to the trap tank 1300.

Figure 23:
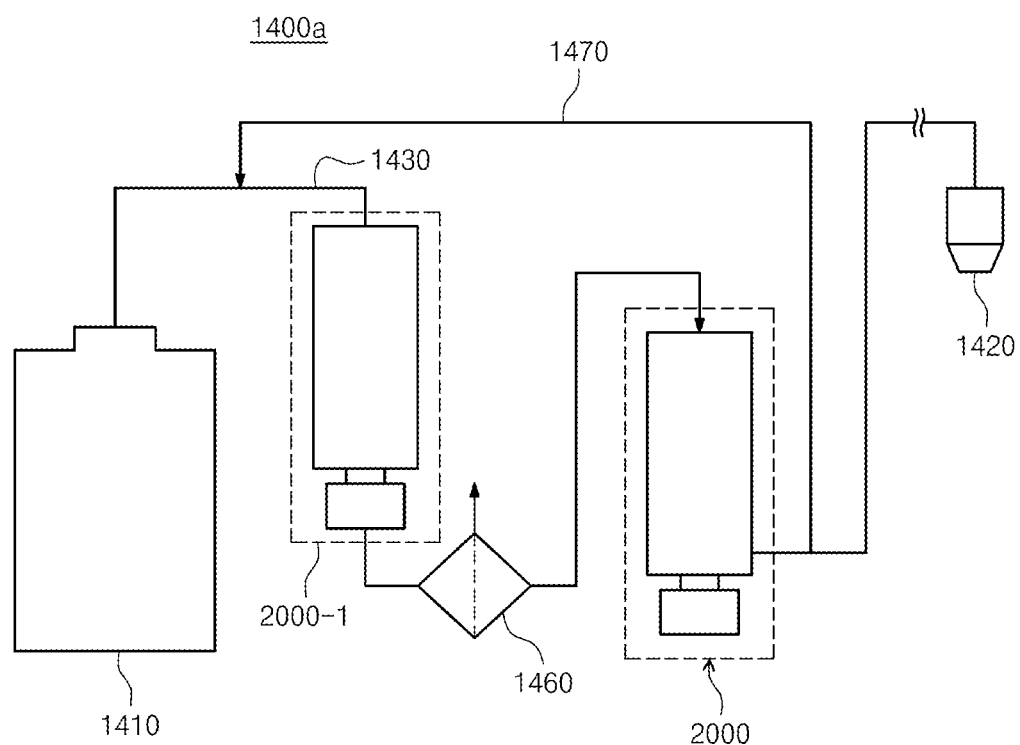
FIG. 23 is a configuration diagram illustrating another example of a liquid supply unit.

FIG. 23 is a configuration diagram illustrating a modified example of a liquid supply unit.

As illustrated in FIG. 23, the liquid supply unit 1400a includes a nozzle 1420, a liquid receiving member 1410, a liquid supply line 1430, a pump 2000, a filter 1460, and a purge line 1470, and these are provided in configurations and functions substantially similar to those of the liquid supply unit 1400 shown in FIG. 10, and The difference is that a pump 2000-1 is additionally installed instead of the trap tank. Here, the pump 2000 and the pump 2000-1 are the same pump.

Figure 11:
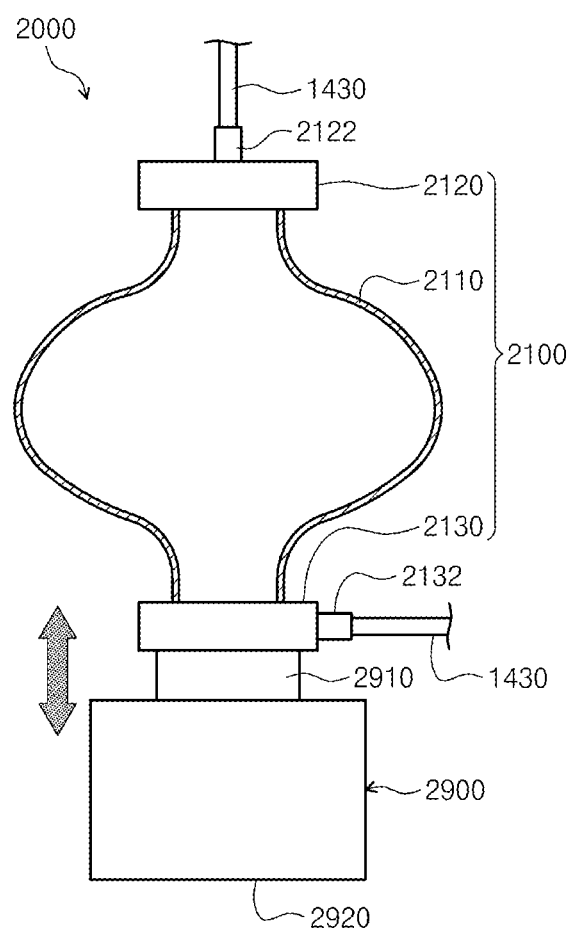
FIG. 11 is a diagram illustrating a pump illustrated in FIG. 10.
Figure 12:
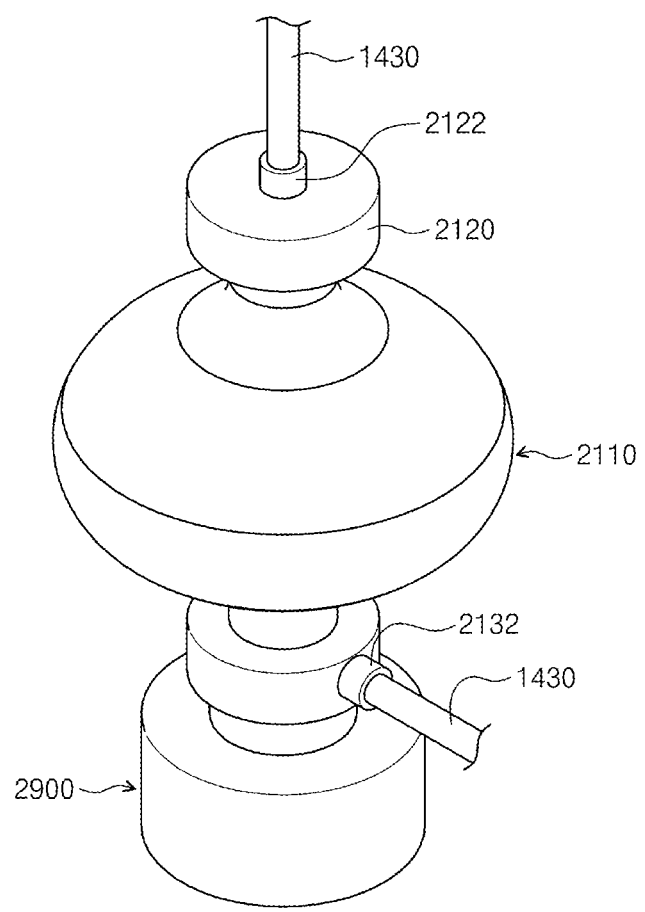
FIG. 12 is a perspective view illustrating the pump illustrated in FIG. 11.
Figure 13:
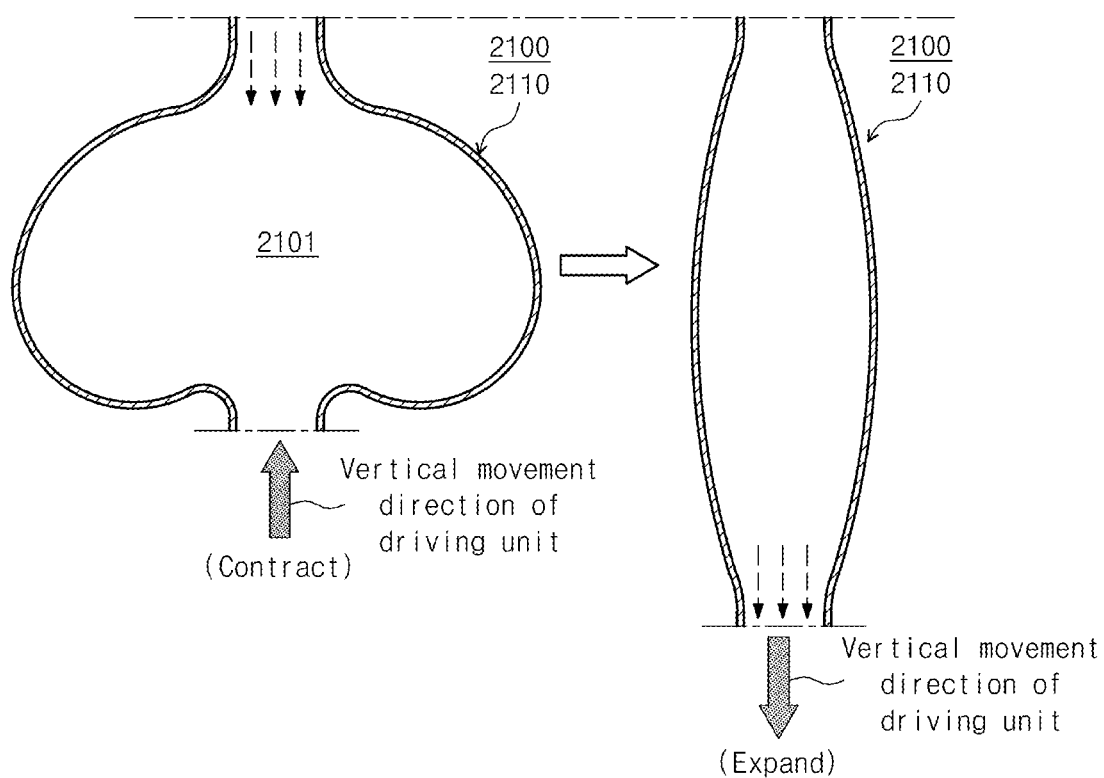
FIG. 13 is a diagram illustrating an expansion and contraction state of a tube.

FIG. 11 is a diagram illustrating a pump illustrated in FIG. 10, FIG. 12 is a perspective view illustrating the pump illustrated in FIG. 11, and FIG. 13 is a diagram illustrating a state in which a tube is expanded and contracted.

The pump 2000 may include a tube 2100 and a driving unit 2900. The pump 2000 contracts and expands the tube 2100 in the longitudinal direction to induce a change in volume of the tube 2100 to discharge the processing liquid in the tube.

For example, the tube 2100 may include a flexible tube body 2110, a first flange 2120 provided at one end of the tube body 2110, and a second flange 2130 provided at the other end of the tube body 2110.

The tube 2100 performs contraction and expansion operations by vertical movement force applied from the outside. The tube 2100 may be made of a flexible polymer material. Of course, as long as the material of the tube 2100 can be contracted and expanded when external force is applied, any material may be used. The tube 2100 is preferably manufactured to have elastic restoring force so that when the externally applied force is released, the tube 2100 can be restored to its initial state (for example, the contracted state of FIG. 13). Of course, the tube 2100 may be manufactured so as not to have elastic restoring force. This is because the tube 2100 may be restored to its initial state by using force applied from the outside for contraction and expansion of the tube 2100. However, when the tube 2100 is manufactured to have elastic restoring force so that the tube 2100 can be restored to its initial state by itself, it is possible to reduce the load of externally applied force, so that the tube 2100 is preferably manufactured to have elastic restoring force.

The tube body 2110 has a hollow part (pump chamber) therein. Both ends of the tube body 2110 are opened to allow the processing liquid to enter and exit. When viewing the cross-section of the tube body 2110, the tube body 2110 has a jar shape in which the space increases from a chemical liquid inlet and a chemical liquid outlet to the center. In the pump chamber, when the tube body 2110 is contracted in the longitudinal direction by the driving unit 2900, the internal volume ay increase (see FIG. 13), and when the tube 2100 expands (stretches) in the longitudinal direction, the internal volume may be reduced. However, the shape of the tube body 2110 is not limited thereto.

Referring back to FIGS. 11 to 13, the first flange 2120 is coupled to the upper end of the tube body 2110 to seal the upper portion of the tube body 2110. The first flange 2120 may have an inlet 2122 for introducing the processing liquid into the inner space of the tube body 2110.

The second flange 2130 is coupled to the lower end of the tube body 2110 to seal the lower portion of the tube body 2110. The second flange 2130 may be formed with an outlet 2132 through which the processing liquid is discharged from the inner space of the tube body 2110.

The first flange 2120 may be fixed to a separate structure so that movement is not allowed. The second flange 2130 is connected to the driving unit 2900 to enable vertical movement.

The driving unit 2900 includes a vertical moving body 2910 for contracting and expanding the tube 2100. The vertical moving body 2910 may include a ball screw that is raised and lowered by the rotational force of the motor 2920. The driving unit 2900 may include a speed reducer for speed control or the like. The vertical moving body 2910 of the driving unit 2900 may be connected to the second flange 2130.

According to the present invention, since the motor force of the driving unit 2900 is directly transmitted to the second flange 2130 in a ball screw method, there is no need for an additional device, such as an LM guide, thereby reducing the size of the pump.

The operation of the pump having the above-described structure is as follows. Referring to FIGS. 11 to 13, in the suction operation of the pump 2100, when the tube body 2110 is restored to the contracted state in the state where the inlet 2122 is opened and the outlet 2132 is closed, the processing liquid flows into the hollow part of the tube body 2110 through the inlet 2122. In the discharging operation of the pump 2100, when the tube body 2110 is expanded in the longitudinal direction in the state where the inlet 2122 is closed and the outlet 2132 is opened, the processing liquid filled in the hollow part of the tube body 2110 is discharged through the outlet 2132 while the volume of the hollow part of the tube body 2110 is decreased.

Figure 14:
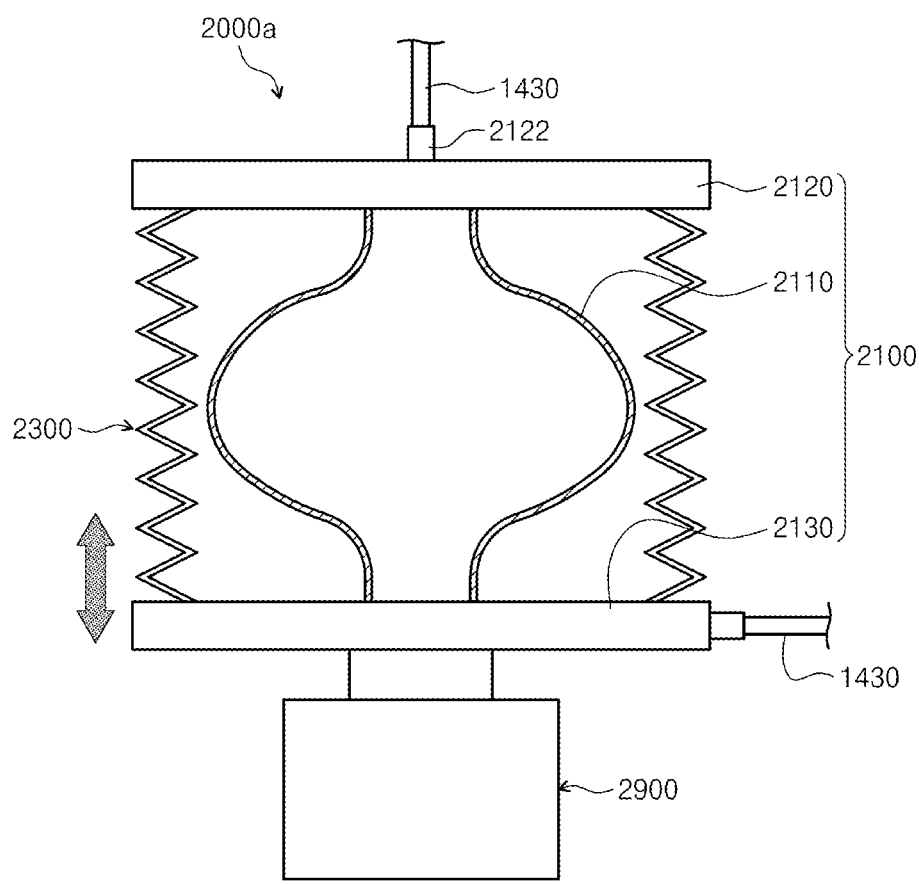
FIG. 14 is a front view illustrating a second exemplary embodiment of the pump.

FIG. 14 is a front view illustrating a second exemplary embodiment of the pump.

As illustrated in FIG. 14, the pump 2000a includes a tube 2100 and a driving unit 2900, and the tube 2100 and the driving unit 2900 are provided with substantially similar configurations and functions to those of the tube 2100 and the driving unit 2900 of the pump 2000 shown in FIG. 11, so that hereinafter, the second exemplary embodiment will be mainly described with respect to the differences from the present exemplary embodiment.

In the present exemplary embodiment, the tube 2100a is characterized in including a sealing case 2300. The sealing case 2300 may be provided to surround the tube body 2110. The sealing case 2300 may prevent leakage of the chemical liquid from the tube body 2110 to the outside of the pump. For example, the sealing case 2300 may be provided in a bellows shape. The sealing case 2300 may be filled with an incompressible fluid therein. The incompressible fluid may be inert gas (for example, nitrogen gas) or a liquid. The incompressible fluid filled in the sealing case 2300 blocks moisture penetration. One end of the sealing case 2300 may be fixed to the first flange 2120, and the other end of the sealing case 2300 may be connected to the second flange 2130.

Figure 15:
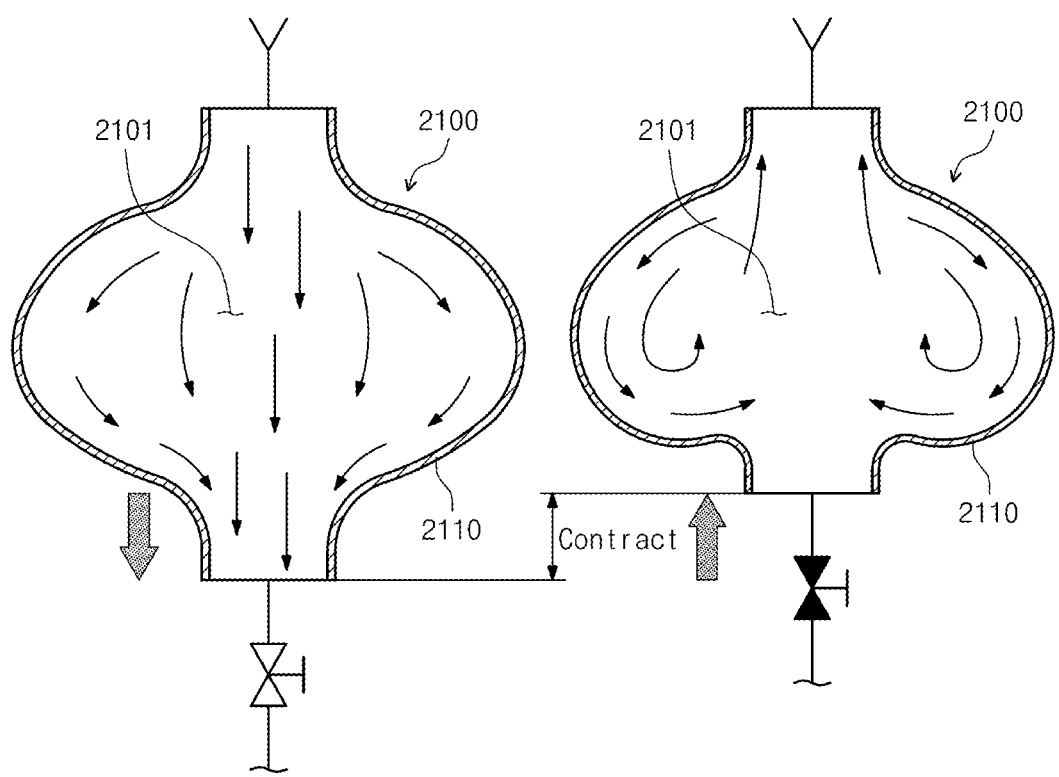
FIG. 15 is a diagram for explaining a processing liquid circulation operation in the tube.

FIG. 15 is a diagram for explaining a processing liquid circulation operation in the tube.

The tube 2100 may improve a problem that occurs when the processing liquid stagnates.

As shown in FIG. 15, when the tube 2100 is restored to its initial state, the processing liquid is introduced into the tube body 2110. In this state, when the valve of the outlet is closed (the state filled with black in the drawing is the closed state) and the tube 2100 is moved at a predetermined interval in the contraction direction by the driving unit, the processing liquid inside the tube body 2110 is circulated along the curved inner surface of the tube body 2110 (indicated by an arrow in the drawing). Here, the contraction operation of the tube body 2110 is not for supplying a chemical liquid, but for preventing stagnation of the processing solution. The processing liquid circulation is preferably repeated several times in the standby state where the processing liquid is not supplied, and through this, the chemical liquid inside the tube body 2100 is forcibly circulated to prevent stagnant phenomenon.

Figure 16:
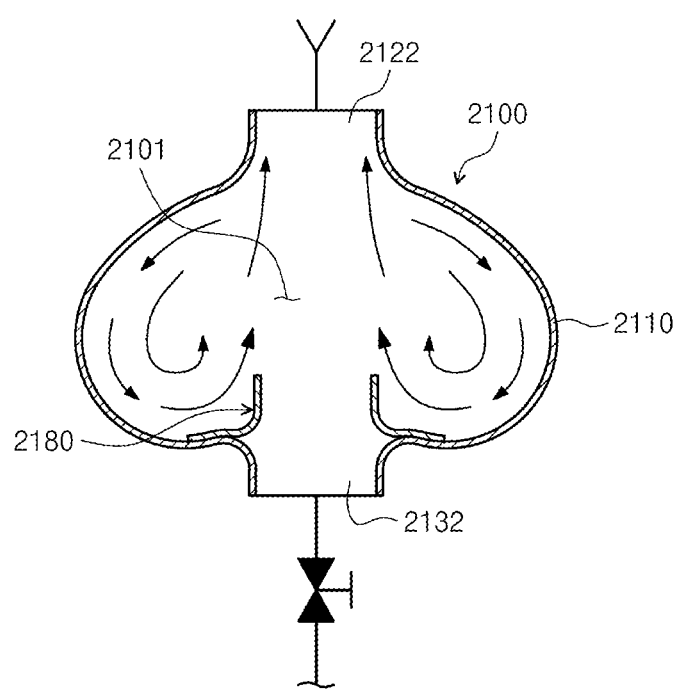
FIG. 16 is a diagram illustrating another example of the tube.

FIG. 16 is a diagram illustrating another example of the tube. As illustrated in FIG. 16, the tube 2100 is characterized in a fixed baffle 2180 for accelerating the circulation of the chemical liquid in the pump chamber 2101. The fixed baffle 2180 may be provided with an open center. The fixed baffle 2180 may be positioned adjacent to the outlet 2132 of the tube body 2110. The center of the fixed baffle 2180 may be curved toward the inlet 2122. In FIG. 16, the arrow shows the circulation of the processing liquid by the circulation operation of the processing liquid inside the tube body 2110.

Figure 17:
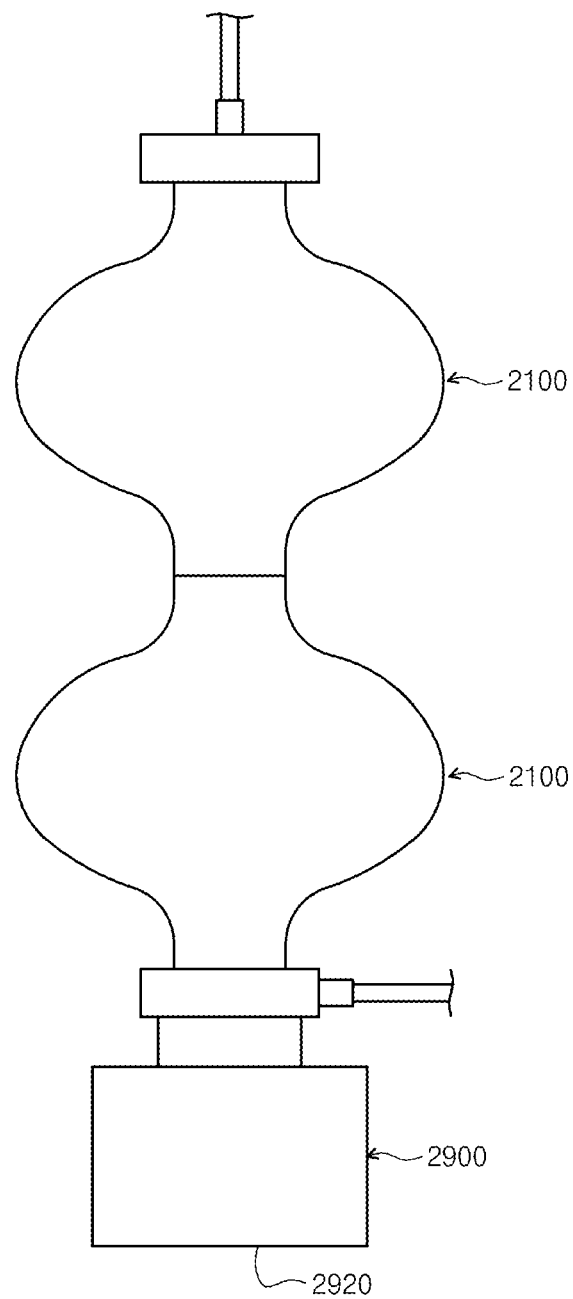
FIGS. 17 to 18B are diagrams illustrating various modified examples of the pump.
Figure 18A:
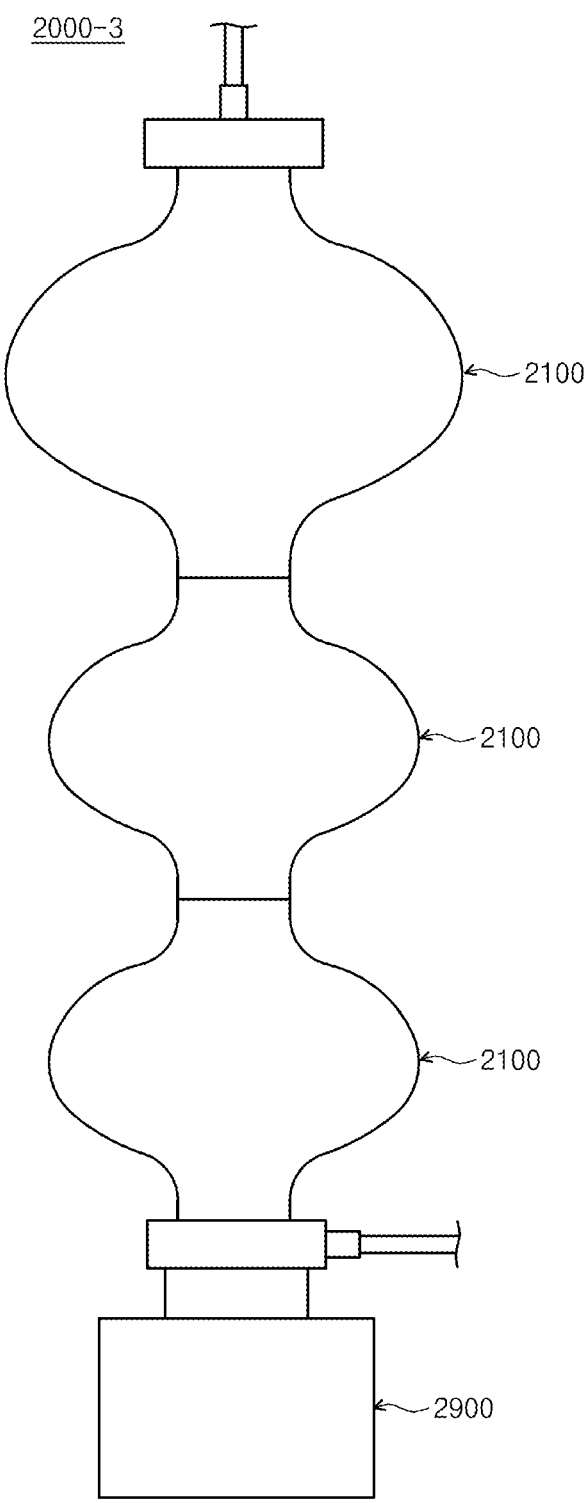
Figure 18B:
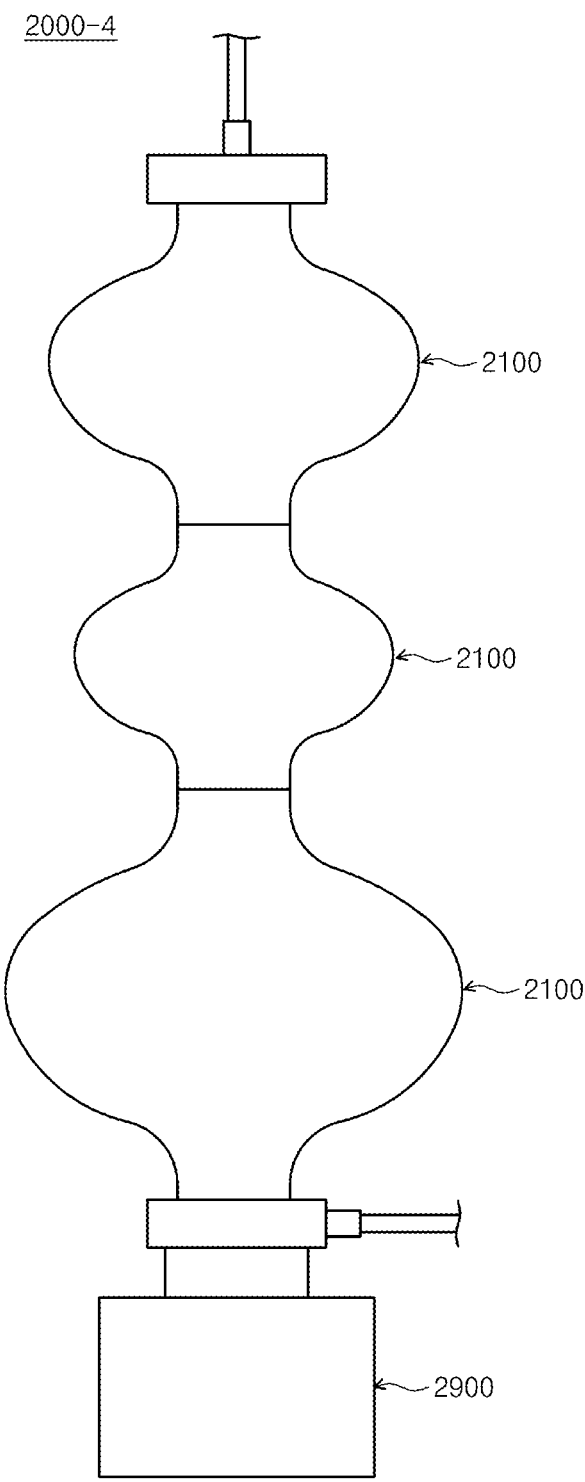

FIGS. 17 to 18B are diagrams illustrating various modified examples of the pump, and herein, the driving unit is omitted.

As shown in FIG. 17, a pump 2000-2 may be provided in a form in which two tubes 2100 are connected in series. In this case, the connected tubes 2100 may have the same shape.

As illustrated in FIGS. 18A and 18B, a pump 2000-3 may be provided such that three tubes 2100 are connected in series, and the sizes of the tubes 2100 may be different from each other.

Figure 19:
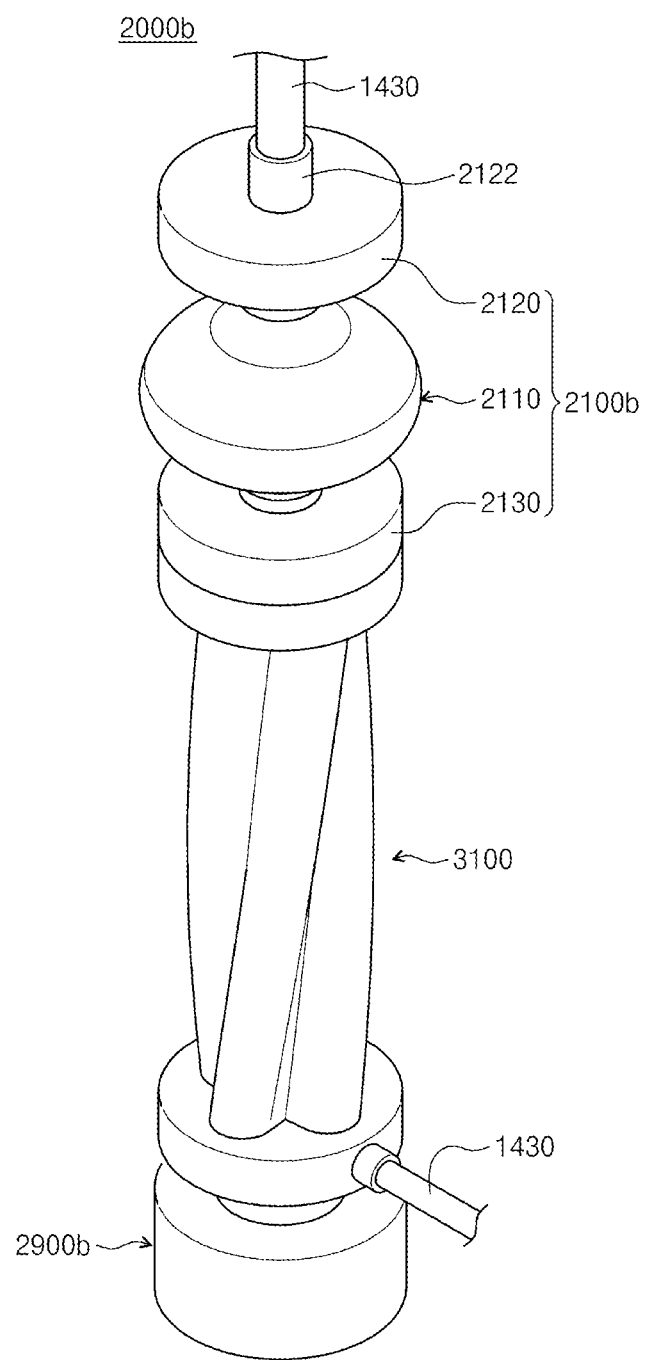
FIG. 19 is a diagram illustrating showing a second exemplary embodiment of the pump.

FIG. 19 is a diagram illustrating showing a second exemplary embodiment of the pump.

Referring to FIG. 19, the pump 2000*b* may include a first tube 2100*b*, a second tube 3100, and a driving unit 2900*b*.

The pump 2000*b* may discharge the processing liquid through a change in volume due to contraction/expansion of the first tube 2100*b* and twist of the second tube 3100. Here, since the first tube 2100*a* and the driving unit 2900*a* are provided with substantially similar configurations and functions to those of the tube 2100 and the driving unit 2900 shown in FIG. 11, so that hereinafter, the second exemplary embodiment will be mainly described with respect to the differences from the present exemplary embodiment.

In the present exemplary embodiment, the second tube 3100 is provided between the driving unit 2900*a* and the first tube 2100*a* so as to be connected in series with the first tube 2100*a*. The second tube 3100 may be provided in a torsion method for discharging a chemical liquid through a change in volume due to twist.

The driving unit 2900*a* may be provided to simultaneously transmit rotational force and vertical movement force to the second tube 3100 to contract and expand the first tube 2100 while twisting the second tube 3100.

Figure 20A:
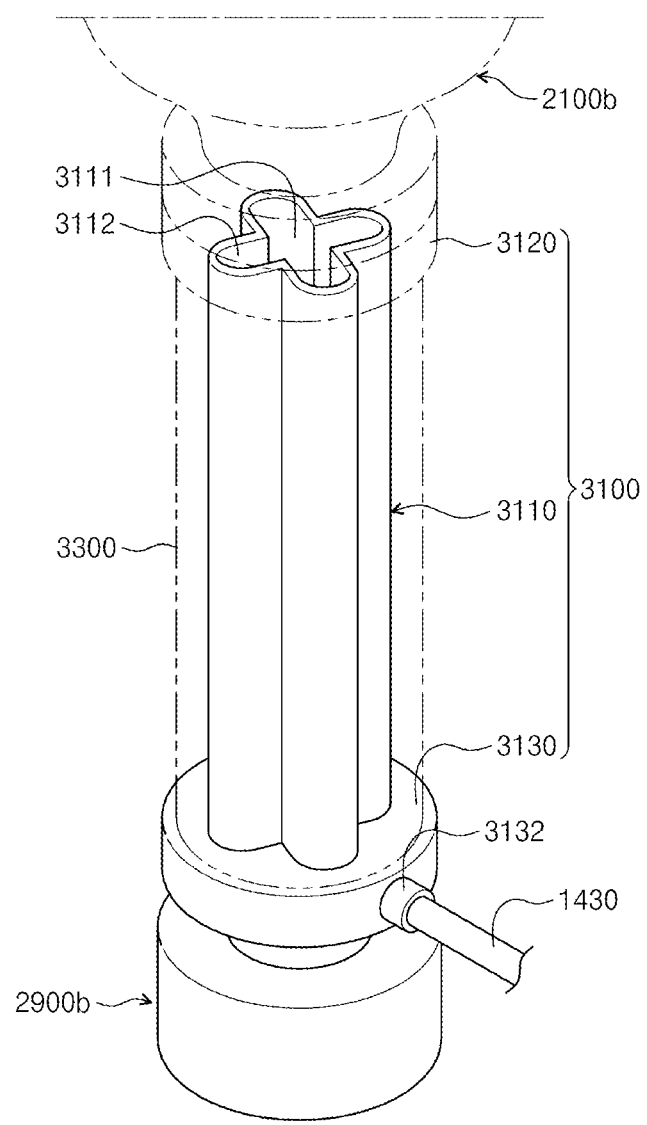
FIGS. 20A and 20B are diagrams for explaining the second tube shown in FIG. 19.
Figure 20B:
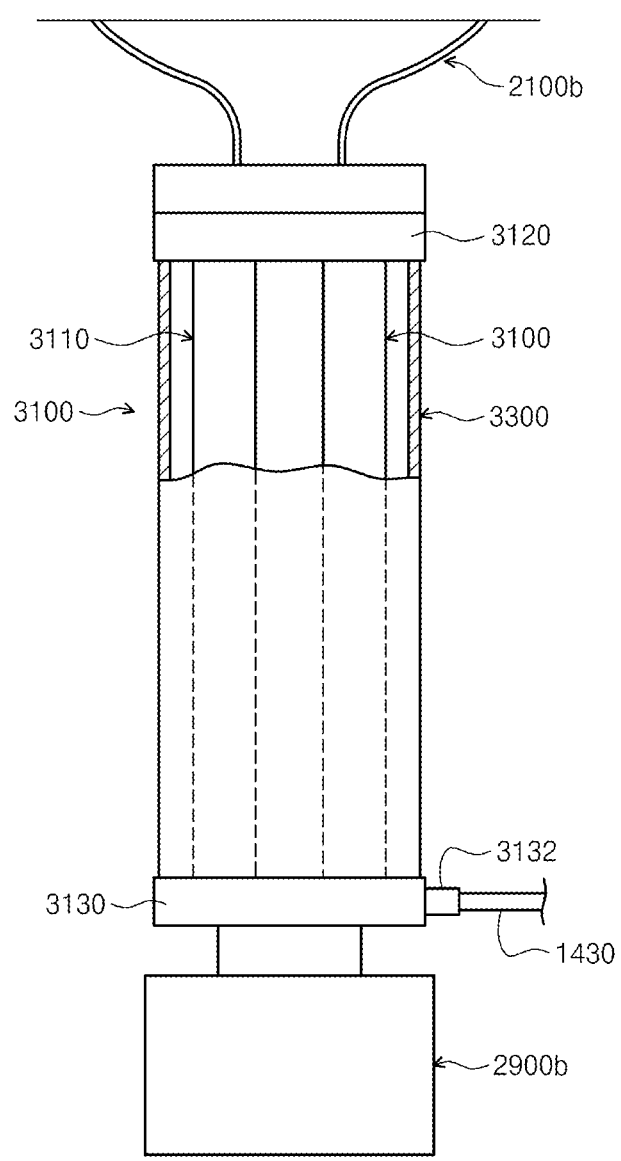

FIGS. 20A and 20B are diagrams for explaining the second tube shown in FIG. 19.

Referring to FIGS. 20*a* and 20*b*, the second tube 3100 may include a flexible tube body 3110, a first flange 3120 provided at one end of the tube body 3110, and a second flange 3130 provided at the other end of the tube body 3110.

The second tube 3100 performs a twisting operation by rotational force applied from the outside. The second tube 3100 may be made of a flexible polymer material. Of course, as long as the material of the second tube 3100 is capable of being twisted when external force is applied, any material may be used. The second tube 3100 is preferably manufactured to have elastic restoring force so that the tube can be restored to its initial state when the externally applied force is released. Of course, the second tube 3100 may be manufactured so as not to have elastic restoring force. This is because the second tube 3100 may be restored to its initial state by using force applied from the outside for the twisting operation of the second tube 3100. However, when the second tube 3100 is manufactured to have elastic restoring force so that the second tube 3100 can be restored to its initial state by itself, the load of externally applied force may be reduced, so that the second tube 3100 is preferably manufactured to have elastic restoring force.

The tube body 3110 has a certain length and has a hollow part (pump chamber) therein. Both ends of the tube body 2110 are opened to allow the processing liquid to enter and exit. When viewing the cross-section of the tube body 3110, the tube body 3110 has a central core space 3110, and four wing spaces 3112 arranged along the circumference around the core space 3111. As such, the cross-section of the tube body 3110 has a four-leaf shape. However, the shape of the tube body is not limited thereto. For example, the cross-sections of the tube body 3110 may be provided in various multi-leaf shapes, such as two-leaf, three-leaf, or five-leaf types.

The tube body 3110 is illustrated as having a straight shape in the longitudinal direction, but is not limited thereto. For example, the tube body 3100 may be formed in a spirally twisted structure around a core. As such, since the tube body 3100 has a twisted shape from the beginning, a volume change may be increased when the tube body 3100 is twisted by the driving unit, and stable twisting may be possible. Here, the twist angle of the tube body may be variously changed.

In addition, the tube body may have a different cross-sectional shape between the upper end and the lower end. For example, the tube body 3110 may be provided in a shape in which the upper end cross-section of the tube body 3110 has a large valley between the wing spaces, and the valley between the wing spaces is smoothed toward the lower end of the tube body 3110.

In the meantime, the first flange 3120 is coupled to the upper end of the tube body 3110 to seal the upper portion of the tube body 3110. The first flange 3120 may be connected to the second flange 2130 of the first tube 2100*a*. The inner space of the first tube 2100b and the inner space of the second tube 3100 may be connected to each other.

The second flange 3130 is coupled to the lower end of the tube body 3110 to seal the lower portion of the tube body 3110. The second flange 3130 may be formed with an outlet 3132 through which the processing liquid is discharged from the inner space of the tube body 3110.

The first flange 3120 may be fixed to a separate structure so that vertical movement is possible and rotation is not allowed. The second flange 3130 is connected to the driving unit 2900b so as to be rotated by receiving rotational force.

Figure 21:
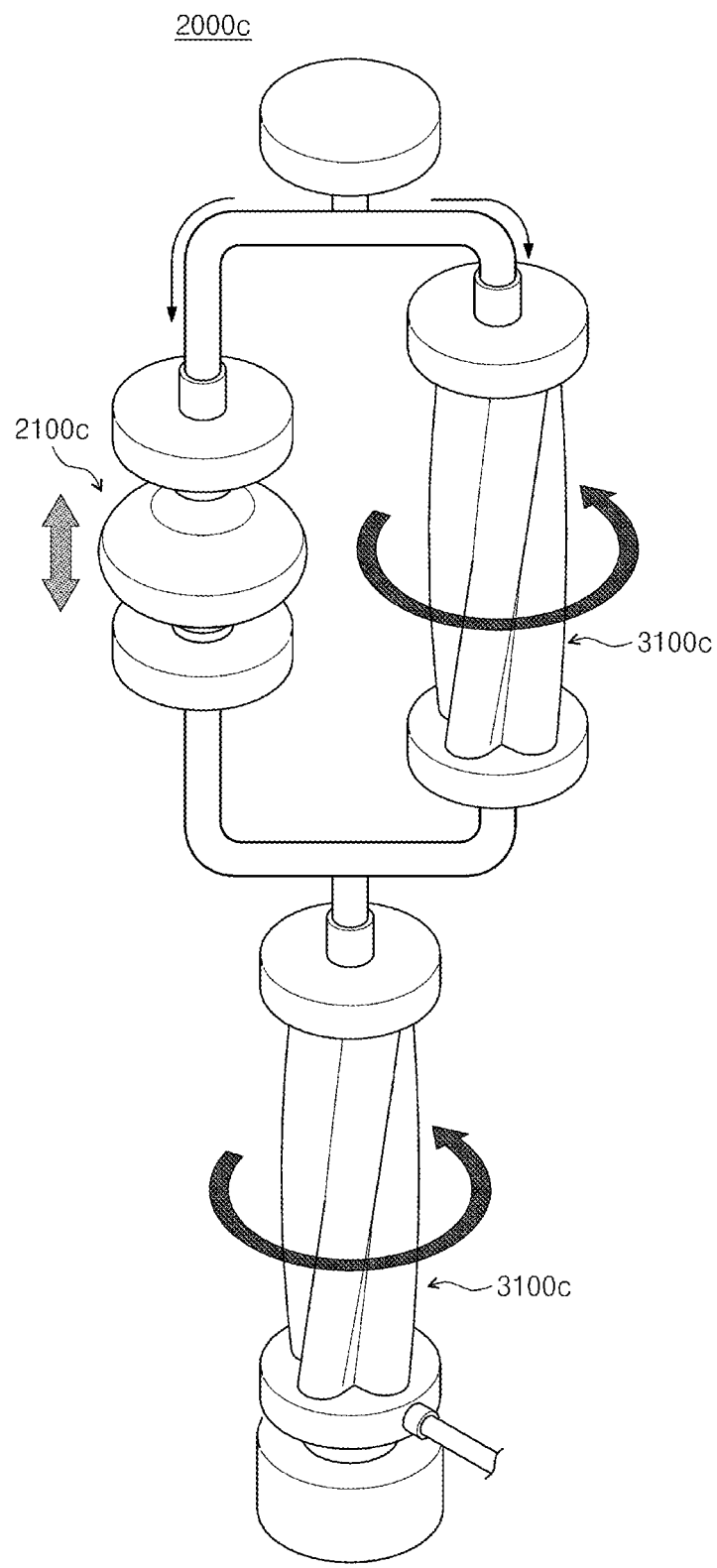
FIG. 21 is a configuration diagram showing a pump according to a third exemplary embodiment.

In the present exemplary embodiment, the second tube 3100 has a sealing case 3300. The sealing case 3300 may be provided to surround the tube body 3110. The sealing case 3300 may prevent leakage of the chemical liquid from the tube body 3110 out of the pump. For example, the sealing case 3300 may be provided in a cylindrical shape. The sealing case 3300 may be filled with an incompressible fluid therein. The incompressible fluid may be inert gas (for example, nitrogen gas) or a liquid. The incompressible fluid filled in the sealing case 3300 blocks moisture penetration. One end of the sealing case 3300 may be fixed to the first flange 3120, and the other end of the sealing case 3300 may be connected to the second flange 3130, and a bearing (not illustrated) may be provided therebetween. (prevent rotation of the sealing case when the second flange is rotated). FIG. 21 is a configuration diagram showing a pump according to a third exemplary embodiment, and FIG. 22 is a configuration diagram showing a pump according to a fourth exemplary embodiment.

Referring to FIG. 21, the pump 2000c according to the third exemplary embodiment may include a first tube 2100c, a second tube 3100c, a third tube 4100, and a driving unit 2900c. Here, there is a difference from the second exemplary embodiment in that the first tube 2100c and the second tube 3100c are arranged in parallel (for convenience of illustrating, the driving unit of each tube is omitted).

The first tube 2100c is substantially the same as the tube 2100 of the contraction/expansion method shown in FIG. 11, and the second tube 3100c and the fourth tube 4100 are provided in a configuration and function substantially similar to that of the second tube 3100a illustrated in FIGS. 20A and 20B, and thus detailed descriptions thereof will be omitted.

Figure 22:
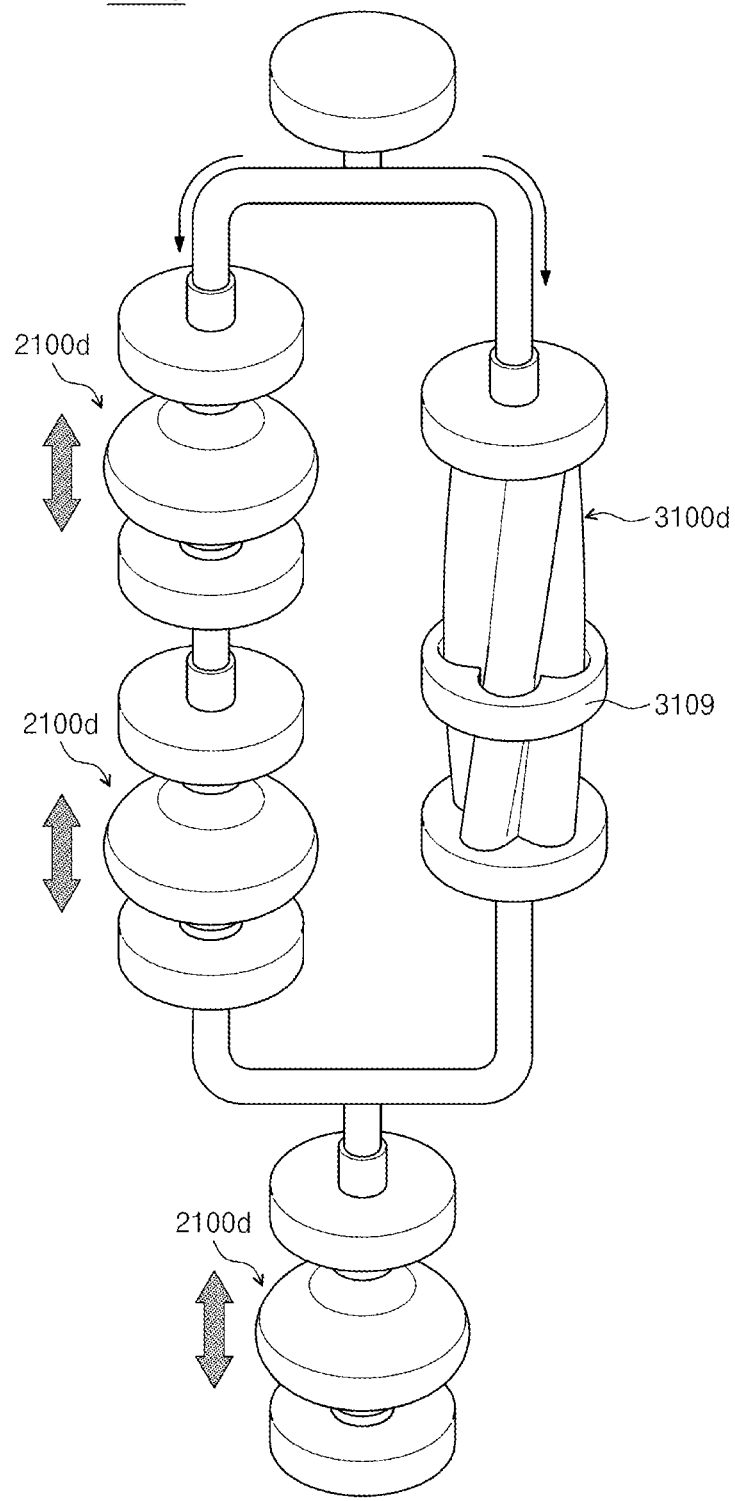
FIG. 22 is a configuration diagram showing a pump according to a fourth exemplary embodiment.

Referring to FIG. 22, the pump 2000d according to the fourth exemplary embodiment may include first tubes 2100d, a second tube 3100d, and a driving unit 2900d.

The first tube 2100d is substantially the same as the tube 2100 of the contraction/expansion method shown in FIG. 11, and the second tube 3100d is provided in a configuration and function substantially similar to that of the second tube 3100a illustrated in FIGS. 20A and 20B, and thus detailed descriptions thereof will be omitted. However, the second tube 3100d has some differences in that a rotating body 3109 for twisting the tube is mounted in a ring shape in the middle of the tube.

Here, the pump 2000d is different from the third exemplary embodiment in that the two first tubes 2100d are arranged in series. For convenience of illustrating, the driving units of the first tube 2100d and the second tube 3100d are omitted.

The foregoing detailed description illustrates the present invention. In addition, the above description shows and describes the exemplary embodiments of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A chemical liquid supply pump, comprising:
 a tube including a pump chamber communicating with a chemical liquid inlet and a chemical liquid outlet, and configured to discharge a chemical liquid through a change in volume due to contraction and expansion;
 a ball screw contracting or expanding the tube in a longitudinal direction of the tube; and
 a fixed baffle including a plate that protrudes from an inner edge of the chemical liquid outlet and curves toward the chemical liquid inlet to enhance a circulation of the chemical liquid in the pump chamber.

2. The chemical liquid supplying pump of claim 1, wherein a cross-section of the pump chamber is provided in a shape of a jar in which a space becomes wider toward a center of the pump chamber from the chemical liquid inlet and becomes wider from the chemical liquid outlet toward the center of the pump chamber, and
 when the tube is contracted in the longitudinal direction by the ball screw, a radius of the pump chamber is increased, and when the tube is expanded in the longitudinal direction, the radius of the pump chamber is decreased.

3. The chemical liquid supplying pump of claim 1, wherein the tube includes:
 a flexible tube body having a jar shape of which a radius is increased from the chemical liquid inlet to a center of the pump chamber, and the radius is decreased from the center of the pump chamber to the chemical liquid outlet;
 a first flange provided at one end of the tube body and including the chemical liquid inlet; and
 a second flange provided at an other end of the tube body and including the chemical liquid outlet.

4. The chemical liquid supplying pump of claim 3, wherein in the tube, any one of the first flange and the second flange is connected to the ball screw, so that the tube body is contracted and expanded by an operation of the ball screw.

5. The chemical liquid supplying pump of claim 2, wherein the tube further comprising:
 a sealing case provided to surround the tube.

6. The chemical liquid supplying pump of claim 5, wherein the sealing case is provided in a form of a bellows, and is provided to interlock with contraction and expansion operations of the tube.

7. The chemical liquid supplying pump of claim 5, wherein the sealing case is filled with an incompressible fluid therein.

8. The chemical liquid supplying pump of claim 3, wherein the plate functions as a valve for accelerating the circulation of the chemical liquid in the pump chamber.

9. The chemical liquid supplying pump of claim 8, wherein the valve is provided in a form of an open center.

10. The chemical liquid supplying pump of claim 3, wherein a plurality of the tube bodies is connected in series.

11. The chemical liquid supplying pump of claim 10, wherein the plurality of the tube bodies connected in series is provided with different sizes from each other.

12. The chemical liquid supplying pump of claim 1, wherein the tube further comprising:
a torsion tube provided between the ball screw and the tube so as to be connected in series with the tube including the pump chamber, and configured to discharge the chemical liquid through a change in volume due to torsion,
wherein the ball screw transmits rotational force and vertical movement force to the torsion tube in order to contract and expand the tube including the pump chamber while twisting the torsion tube.

13. The chemical liquid supplying pump of claim 12, wherein the torsion tube includes:
a flexible torsion tube body; and
a sealing case provided to surround the torsion tube body and filled with an incompressible fluid therein, and
one end of the torsion tube body is connected to the tube including the pump chamber, and an other end of the torsion tube body receives the rotational force and the vertical movement force from the ball screw.

14. A chemical liquid supply pump, comprising:
a tube including a pump chamber communicating with a chemical liquid inlet and a chemical liquid outlet, and configured to discharge a chemical liquid through a change in volume due to contraction and expansion; and
a ball screw contracting or expanding the tube in a longitudinal direction of the tube,
wherein the tube includes:
a flexible tube body including a pump chamber which has an increased radius when the tube is contracted in the longitudinal direction and has a decreased radius when the tube is expanded in the longitudinal direction, and which has a jar shape of which a radius is increased from the chemical liquid inlet to a center of the pump chamber, and the radius is decreased from the center of the pump chamber to the chemical liquid outlet;
a first flange provided at one end of the tube body and including the chemical liquid inlet;
a second flange provided at an other end of the tube body and including the chemical liquid outlet; and
a fixed baffle, attached to the tube body, and including a plate that protrudes from an inner edge of the chemical liquid outlet and curves toward the chemical liquid inlet to enhance a circulation of the chemical liquid in the pump chamber.

15. The chemical liquid supplying pump of claim 14, wherein the tube further comprising:
a sealing case provided to surround the tube and filled with an incompressible fluid therein,
wherein the sealing case is provided in a form of a bellows, and is provided to interlock with contraction and expansion operations of the tube.

16. The chemical liquid supplying pump of claim 14, wherein the plate functions as a valve for accelerating the circulation of the chemical liquid in the pump chamber, and the valve is provided in a form of an open center.

17. A chemical liquid supplying apparatus, comprising:
a pump for supplying a chemical liquid to a nozzle that discharges the chemical liquid to a substrate;
a trap tank in which the chemical liquid to be supplied from the pump to the nozzle is temporarily stored;
a bottle containing the chemical liquid stored in the trap tank; and
a filter provided on a path through which the chemical liquid is supplied from the trap tank to the pump,
wherein the pump includes:
a ball screw;
a tube including a pump chamber communicating with a chemical liquid inlet and a chemical liquid outlet, and configured to discharge the chemical liquid while being contracted and expanded in a longitudinal direction by the ball screw,
wherein, when the tube is contracted in the longitudinal direction by the ball screw, a radius of the pump chamber is increased, and when the tube is expanded in the longitudinal direction, the radius of the pump chamber is decreased; and
a fixed baffle including a plate that protrudes from an inner edge of the chemical liquid outlet and curves toward the chemical liquid inlet to enhance a circulation of the chemical liquid in the pump chamber.

18. The chemical liquid supplying apparatus of claim 17, wherein the tube includes:
a flexible tube body having a jar shape of which a radius is increased from the chemical liquid inlet to a center of the pump chamber, and the radius is decreased from the center of the pump chamber to the chemical liquid outlet;
a first flange provided at one end of the tube body and including the chemical liquid inlet; and
a second flange provided at an other end of the tube body and including the chemical liquid outlet, and
any one of the first flange and the second flange is connected to the ball screw, so that the tube body is contracted and expanded by an operation of the ball screw.

19. The chemical liquid supplying apparatus of claim 18, wherein the tube further comprising:
a sealing case provided to surround the tube,
wherein the sealing case is provided in a form of a bellows, and is provided to interlock with contraction and expansion operations of the tube, and
the sealing case is filled with an incompressible fluid therein.

20. The chemical liquid supplying apparatus of claim 18, wherein the tube body further includes a valve for accelerating a circulation of the chemical liquid in the pump chamber, and
the valve is provided in a form of an open center, and
wherein the pump further includes a torsion tube which is provided between the ball screw and the tube including the pump chamber so as to be connected in series with the tube including the pump chamber and discharges the chemical liquid through a change in volume due to torsion, and
the ball screw transmits rotational force and vertical movement force to the torsion tube in order to contract and expand the tube including the pump chamber while twisting the torsion tube, and
wherein the torsion tube has a cross-section having a multi-leaf shape, and has a spirally twisted structure around a core.

* * * * *